United States Patent
Bailey et al.

(10) Patent No.: US 6,878,636 B2
(45) Date of Patent: Apr. 12, 2005

(54) METHOD FOR ENHANCING SUBSTRATE PROCESSING

(75) Inventors: Joel Brad Bailey, Austin, TX (US); Reginald Hunter, Round Rock, TX (US)

(73) Assignee: Applied Materials, Inc., Santa Clara, CA (US)

( * ) Notice: Subject to any disclaimer, the term of this patent is extended or adjusted under 35 U.S.C. 154(b) by 305 days.

(21) Appl. No.: 10/171,503

(22) Filed: Jun. 12, 2002

(65) Prior Publication Data

US 2003/0040193 A1 Feb. 27, 2003

Related U.S. Application Data

(63) Continuation-in-part of application No. 10/006,023, filed on Dec. 6, 2001, now Pat. No. 6,684,523.
(60) Provisional application No. 60/315,102, filed on Aug. 27, 2001.

(51) Int. Cl.[7] ............... H01L 21/302; H01L 21/3065; B08B 3/12
(52) U.S. Cl. .................. 438/706; 438/710; 134/1; 134/1.1
(58) Field of Search ................... 438/706, 710, 438/700; 134/1, 1.1

(56) References Cited

U.S. PATENT DOCUMENTS

| | | | |
|---|---|---|---|
| 5,298,720 A | 3/1994 | Cuomo et al. | 219/121.43 |
| 5,387,777 A | 2/1995 | Bennett et al. | 219/121.43 |
| 5,522,933 A | 6/1996 | Geller et al. | 118/723 E |
| 5,531,862 A | 7/1996 | Otsubo et al. | 156/643.1 |
| 5,665,609 A | 9/1997 | Mori | 438/16 |
| 5,727,332 A | 3/1998 | Thrasher et al. | 34/277 |
| 5,820,329 A | 10/1998 | Derbinski et al. | 414/225 |
| 5,849,135 A | 12/1998 | Selwyn | 156/345 |
| 5,969,934 A | 10/1999 | Larsen | 361/234 |
| 5,971,586 A | 10/1999 | Mori | 364/468.15 |
| 6,106,634 A | 8/2000 | Ghanayem et al. | 134/19 |
| 6,192,601 B1 | 2/2001 | Ghanayem et al. | 34/406 |
| 6,676,800 B1 * | 1/2004 | Festa et al. | 134/1.1 |

* cited by examiner

Primary Examiner—Lan Vinh
Assistant Examiner—Lynette T. Umez-Eronini
(74) Attorney, Agent, or Firm—Moser, Patterson & Sheridan LLP

(57) ABSTRACT

Embodiments of the invention generally provide a method for enhancing chemical reactions within a substrate processing chamber during a substrate processing sequence. The method generally includes supporting a substrate in a face up position on a substrate support member, providing a process gas into the processing chamber, and striking a plasma of the process gas. The method further includes imparting at least one impulse to the substrate support member that is substantially perpendicular to a substrate surface, the at least one impulse being of sufficient magnitude to agitate the substrate surface to expand an exposed surface area of the substrate surface.

18 Claims, 16 Drawing Sheets

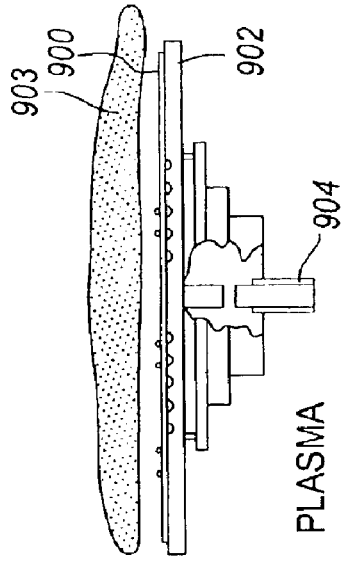
FIG. 9B PLASMA
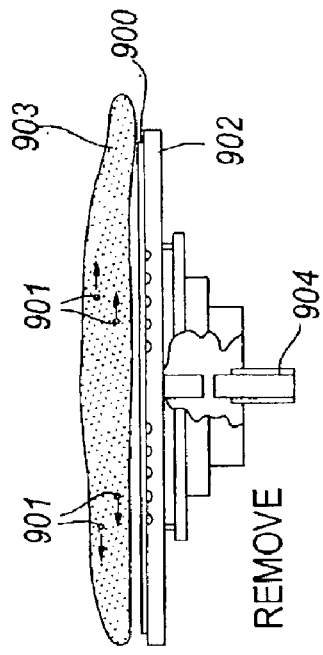
FIG. 9D REMOVE
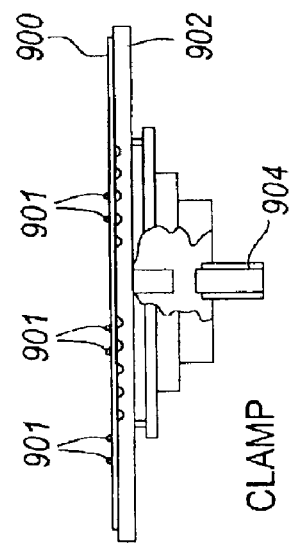
FIG. 9A CLAMP
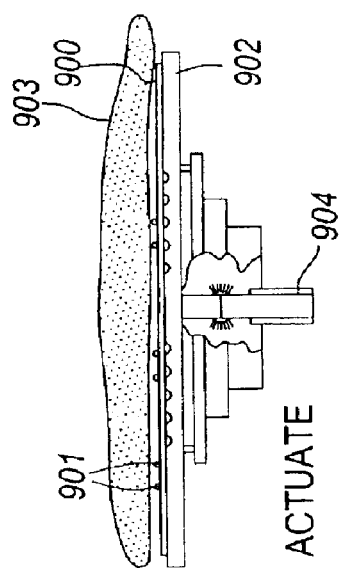
FIG. 9C ACTUATE

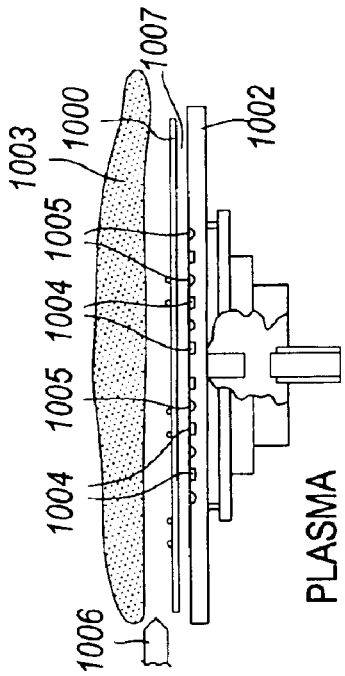
FIG. 10A CLAMP
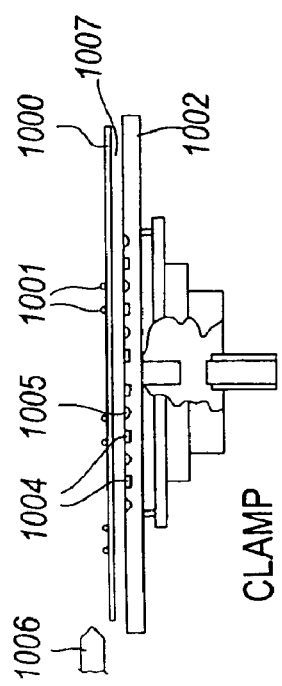
FIG. 10C ACTUATE
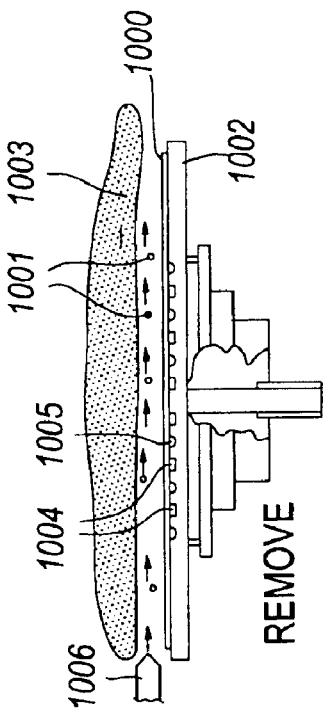
FIG. 10B PLASMA
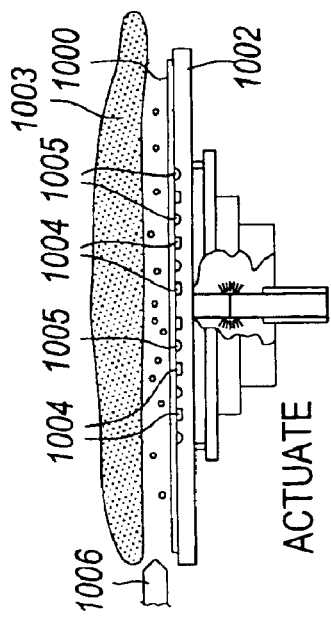
FIG. 10D REMOVE

METHOD FOR ENHANCING SUBSTRATE PROCESSING

CROSS REFERENCE TO RELATED APPLICATIONS

This application is a continuation-in-part of U.S. patent application Ser. No. 10/006,023, filed on Dec. 6, 2001, now U.S. Pat No. 6,684,523 which claims the benefit of U.S. Provisional Patent Application Ser. No. 60/315,102, filed Aug. 27, 2001.

BACKGROUND OF THE INVENTION

1. Field of the Invention

Embodiments of the invention generally relate to an apparatus and method for removing particles from substrate processing systems.

2. Background of the Related Art

Reliably producing semiconductor device features in the sub-quarter micron and smaller size range is a key technology for the next generation of very large scale integration (VLSI) and ultra large-scale integration (ULSI) of semiconductor devices. However, as the fringes of circuit technology are advanced, shrinking feature dimensions places seemingly insurmountable demands upon conventional processing capabilities. For example, conventional semiconductor processing apparatuses and methods configured to manufacture devices with features larger than a quarter micron are not nearly as sensitive to sub-quarter micron size particle contaminants as newer devices having sub-quarter micron sized features. The smaller features of newer devices make it much easier for a sub-quarter micron sized particle to electrically short features. As a result thereof, conventional clean room technology, processing techniques, and substrate cleaning techniques capable of removing and/or avoiding the generation of particles larger than a quarter micron have been acceptable for conventional device manufacture. However, as the size of features in sub-quarter micron devices continues to decrease, device sensitivity to sub-quarter micron sized particles increases substantially, as a single quarter micron sized particle may electrically short two device features together and render the device defective or inoperable. Therefore, the removal of contaminant particles from semiconductor substrates is a key focus in the manufacture of sub-quarter micron and smaller sized semiconductor features.

In order to maintain acceptable device yields, the semiconductor manufacturing industry has already paid considerable attention to obtaining a high standard of cleanliness during the manufacture of semiconductor devices. Clean room technology in particular has evolved in response to contamination issues, and therefore, particle deposition onto substrates as a result of exposure to clean room environments is generally a minority source of substrate contamination. The majority of substrate contamination generally originates from the process tools, materials, and/or interior walls of the processing chambers themselves. Accordingly, manufacturing techniques often incorporate cleaning processes before, during, and/or after one or more of the substrate manufacturing process steps in order generate substrates having minimal particle contamination thereon. As a result, cleaning processes in conventional semiconductor fabrication lines often account for approximately 30 percent or more of the processing time in the manufacture of a device.

An example of a conventional particle cleaning apparatus and method may be found in U.S. Pat. No. 5,849,135 to Selwyn. Selwyn broadly describes a system for particle contamination removal from semiconductor wafers using a plasma and a mechanical resonance agitator. The method and apparatus of Selwyn forms a radio frequency (RF) driven plasma sheath proximate the surface of the substrate having particle contamination thereon. The substrate surface having the contamination particles thereon is bombarded by positive ions and electrons from the plasma. Additionally, a mechanical resonance vibration device is used to introduce a continual vibration into the substrate in a direction perpendicular to its surface. The combination of the bombardment of the particles by the plasma and the continual mechanical vibration operates to break the bonds between the particles on the substrate surface and the substrate surface itself. Once this bond is broken, the particles move away from the surface of the substrate into the plasma sheath and become negatively charged through contact with the electrons in the plasma. This negative charge operates to attract the particles further into the plasma, and therefore, keeps the particles from redepositing on the substrate surface. Additionally, a flowing gas may be introduced into the plasma in a direction parallel to the surface of the substrate, which may operate to further facilitate moving the dislodged particle away from the substrate surface and out of the plasma itself.

FIG. 1 illustrates a conventional substrate cleaning apparatus having a vacuum chamber 30, which includes an RF electrode 10 and a ground electrode 12. RF electrode 10 is capacitively coupled to an RF power source 18. A retaining ring having clamps 26 thereon is suspended above the substrate 14 to restrict substrate travel. Plasma is formed between the RF electrode 10 and the ground electrode 12 when RF energy is applied to the RF electrode 10 by the RF power source 18. A plasma sheath 22 is located above the substrate 14 and below RF electrode 10. The substrate 14 is caused to vibrate at approximately 10 kHz by means of a conducting post 28 that passes through the walls of vacuum chamber 30 and which is driven by a mechanical vibrator 34. A showerhead 38 is used to introduce a gas into vacuum chamber 30 via an inlet tube, which generally establishes a radial gas flow above the substrate surface. A pair of vacuum pumps 46 permit vacuum chamber 30 to be operated in the 1–10 torr range while the radial gas flow is generated. Strong drag forces generated by the high gas flow rate operate to drive the particulate matter out of the plasma and into the pumping ports of the chamber.

Other conventional apparatuses and methods, use reactive gasses in conjunction with mechanical agitation to remove contamination particles from the surface of a substrate. Reactive gasses are used in an attempt to increase the cleaning efficiency, as conventional cleaning apparatuses not using reactive gases generate a cleaning efficiency that is approximately 70 percent for 1.25 micron size particles. However, even these reactive gas-based cleaning apparatuses fall short of sufficiently removing particles from substrate surfaces for purposes of semiconductor manufacturing, and therefore, there is a need for an apparatus capable of efficiently removing particles from substrates sufficient for use in semiconductor manufacturing processes.

SUMMARY OF THE INVENTION

Embodiments of the invention generally provide a method for enhancing chemical reactions within a substrate processing chamber during a substrate processing sequence. The method generally includes supporting a substrate in a face up position on a substrate support member, providing a process gas into the processing chamber, and striking a plasma of the process gas. The method further includes imparting at least one impulse to the substrate support member that is substantially perpendicular to a substrate surface, the at least one impulse being of sufficient magnitude to agitate the substrate surface to expand an exposed surface area of the substrate surface.

Embodiments of the invention may further provide a method for enhancing a chemical reaction during plasma processing between the plasma and the surface of a substrate being processed. The method includes communicating one or more broadband impulses to a substrate support member disposed within the processing chamber, and flexing the surface of the substrate with the broadband impulses during plasma processing to expose more substrate surface area thereto, wherein flexing includes expanding the geometry of the substrate surface so that more regions of the substrate surface are exposed to the plasma.

Embodiments of the invention may further provide a method for facilitating chemical reactions on the surface of a substrate within a plasma processing chamber. The method includes imparting a plurality of broadband impulses to a stem of a substrate support member disposed within a substrate processing chamber with a means for imparting the broadband impulses, the means for imparting the impulse being in mechanical communication with the substrate support member. The method further includes flexing the substrate surface with the broadband impulses during substrate processing, wherein flexing increases the surface area of the substrate exposed to a substrate processing environment.

BRIEF DESCRIPTION OF DRAWINGS

FIGS. 9A–9D illustrate an exemplary method for removing particles from a substrate surface using an actuator to dislodge particles and a plasma sheath to remove the particles from the chamber.

FIGS. 10A–10D illustrate an exemplary method for removing particles from a substrate using an air bearing, a vacuum chuck, and an air knife.

DETAILED DESCRIPTION OF THE INVENTION

A. Overall System Configuration

Figure 1:
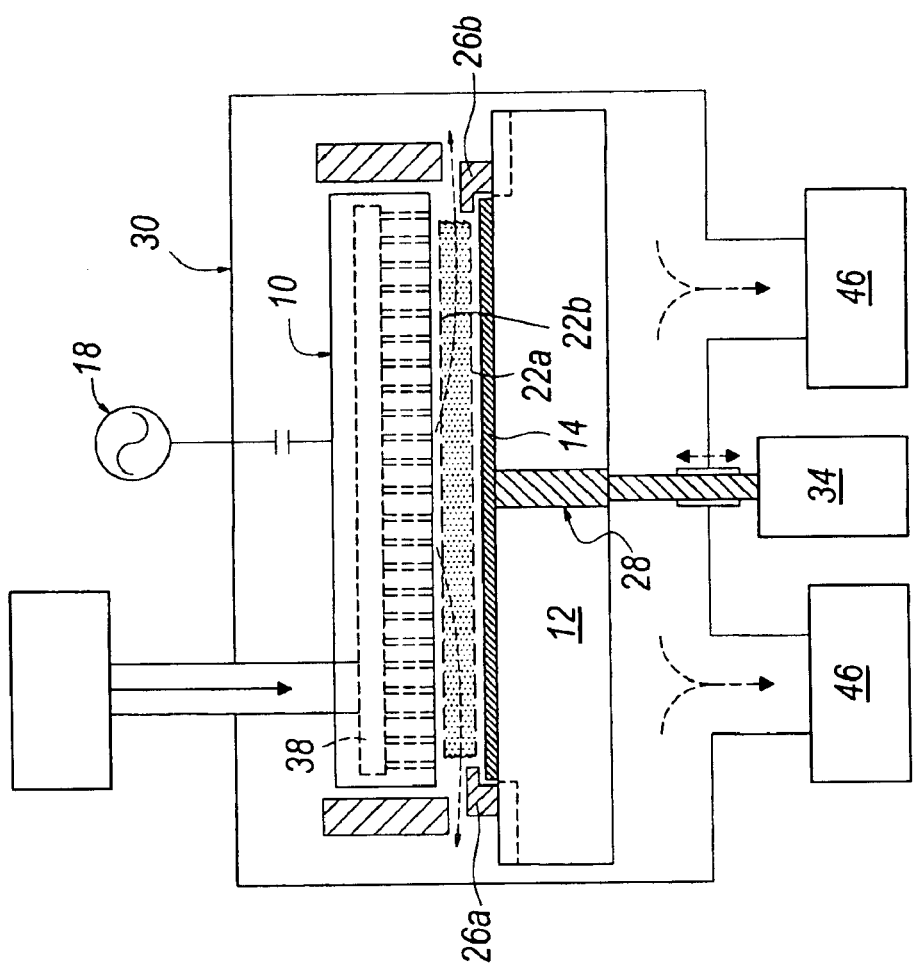
FIG. 1 illustrates a conventional substrate cleaning apparatus.
Figure 2:
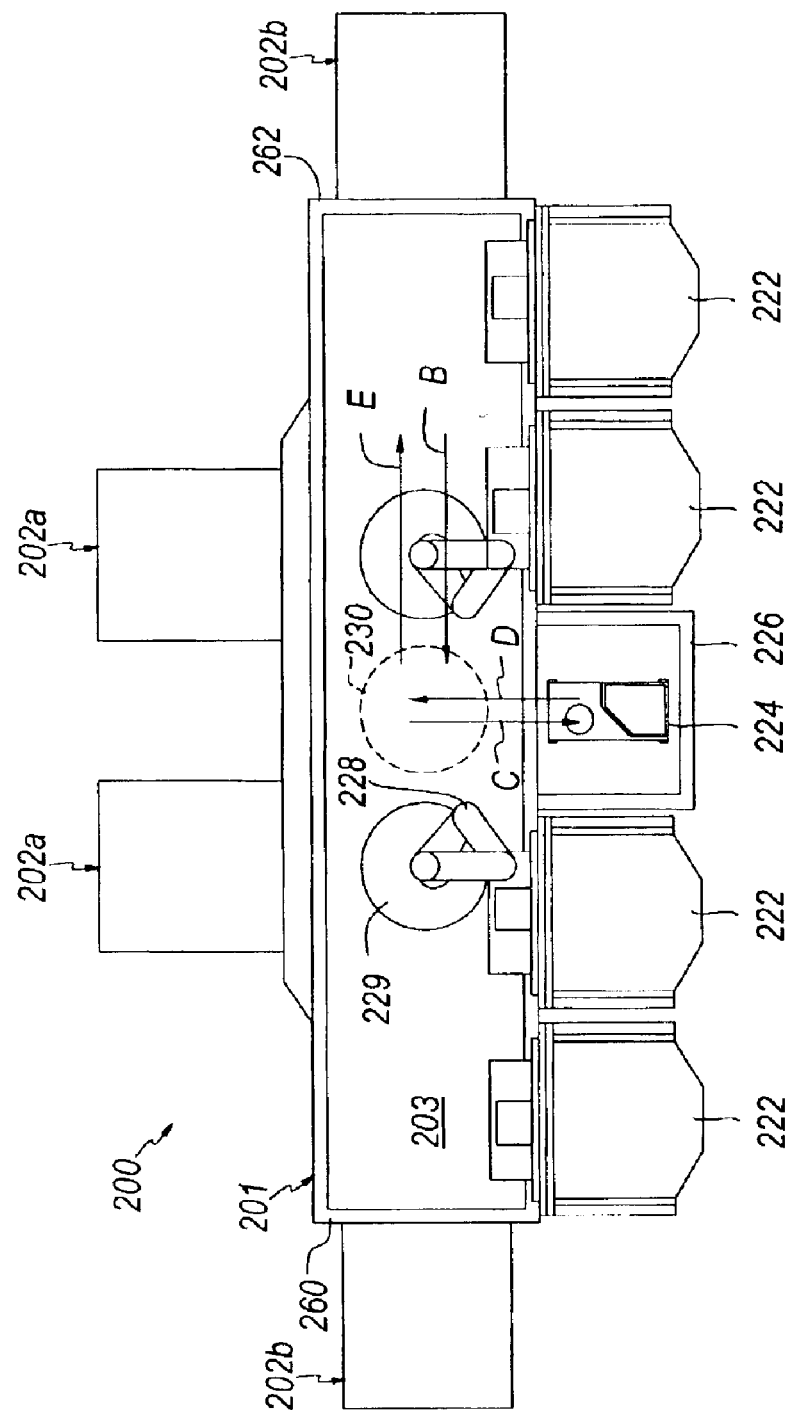
FIG. 2 illustrates a perspective view of an exemplary processing system incorporating the cleaning apparatus of the invention.

FIG. 2 illustrates one embodiment of a processing system 200 according to aspects of the invention. System 200 includes a factory interface 201 having at least one substrate processing chamber 202a, 202b attached thereto. Factory interface 201 generally operates to transfer substrates from substrate pods seated on pod loaders 222 through an atmospheric pressure clean environment/enclosure 203 to a processing chamber 202a, 202b. The clean environment in enclosure 203 is generally provided through air filtration processes, such as, HEPA filtration, for example. Factory interface 201 may also include a substrate orienter/aligner 224 that is used to properly align the substrates prior to processing. Substrate aligner 224 may be located in a small side chamber 226 attached to factory interface 201, or alternatively, orientor 224 may be positioned within enclosure 203 of factory interface 201 itself. At least one substrate transfer robot 228 is positioned in enclosure 203 to transport substrates between various positions/locations within enclosure 203, and to other locations in communication therewith. Robot 228 may be configured to travel along a track system within enclosure 203 from a first end 260 to a second end 262 of chamber 203 in the directions indicated by arrows "E" and "B". Alternatively, two robots 229 may be fixedly positioned in enclosure 203 to transfer substrates between select groups of chambers or other areas in communication with enclosure 203.

Processing chambers 202a, 202b may be a combination of cleaning chambers, metrology/inspection chambers, and/or other chambers used in substrate processing. For example, chambers 202b may be metrology/inspection chambers, while chambers 202a may be cleaning chambers. Metrology/inspection chambers, as used herein, generally refers to a chamber that is used to detect particles on a substrate or to measure the integrity of devices formed on the substrate. Cleaning chambers, as used herein, generally refers to chambers used to remove particles from substrate surfaces. In configurations using a metrology/inspection chamber 202b, substrates may be examined in metrology/inspection chambers 202b before and/or after being processed in one of cleaning chambers 202a. In configurations using a metrology/inspection chamber 202b, robot 228 may first position substrate 229 in the metrology/inspection chamber 202b for analysis of the substrate and any particles residing thereon. The analysis of the substrate and particles thereon may be controlled, for example, by a microprocessor controller configured to receive input from measuring devices in chamber 202b and output control signals based upon the inputs. The analysis of substrate 229 by metrology/inspection chamber 202b may then be used to calculate parameters used in the cleaning process. Alternatively, the metrology/inspection chamber may be used to check substrates for particles after a cleaning process is complete, and therefore, determine if additional cleaning of the substrate is necessary In another embodiment of the invention, a substrate cleaning apparatus may be positioned within enclosure 203 at location 230, as indicated by the dotted lines. In this configuration, a substrate 229 may be removed from a cassette and placed directly on location 230 for cleaning. In this embodiment chambers 202a and 202b may be used for alternative substrate processing tasks.

In a typical substrate loading and processing procedure, cassettes having substrates therein are placed in pod loaders 222. Robot 228 extends into the cassette positioned on a particular pod loader 222 and removes a substrate 229 therefrom in the direction indicated by arrow "A". If the cleaning process requires substrate alignment, robot 228 may position substrate 229 on a substrate aligner 224 in the direction of arrow "C". After the substrate aligner 224 aligns the wafer, the robot 228 retrieves the substrate in the direction of arrow "D". Thereafter, robot 228 may place substrate 229 in a metrology chamber 202b for analysis of the particles on the substrate. Once the analysis is complete, substrate 229 may be placed in cleaning chamber 202a by robot 228. Once the cleaning process is complete, robot 228 may place the cleaned substrate 229 back in a cassette for removal from the processing system. Alternatively, the inspection process may be eliminated and the robot may simply remove a substrate 229 from a cassette and place the substrate directly into a cleaning chamber 202a for processing. Once the cleaning process is complete, robot 228 may return the substrate 229 to a cassette.

Figure 12:
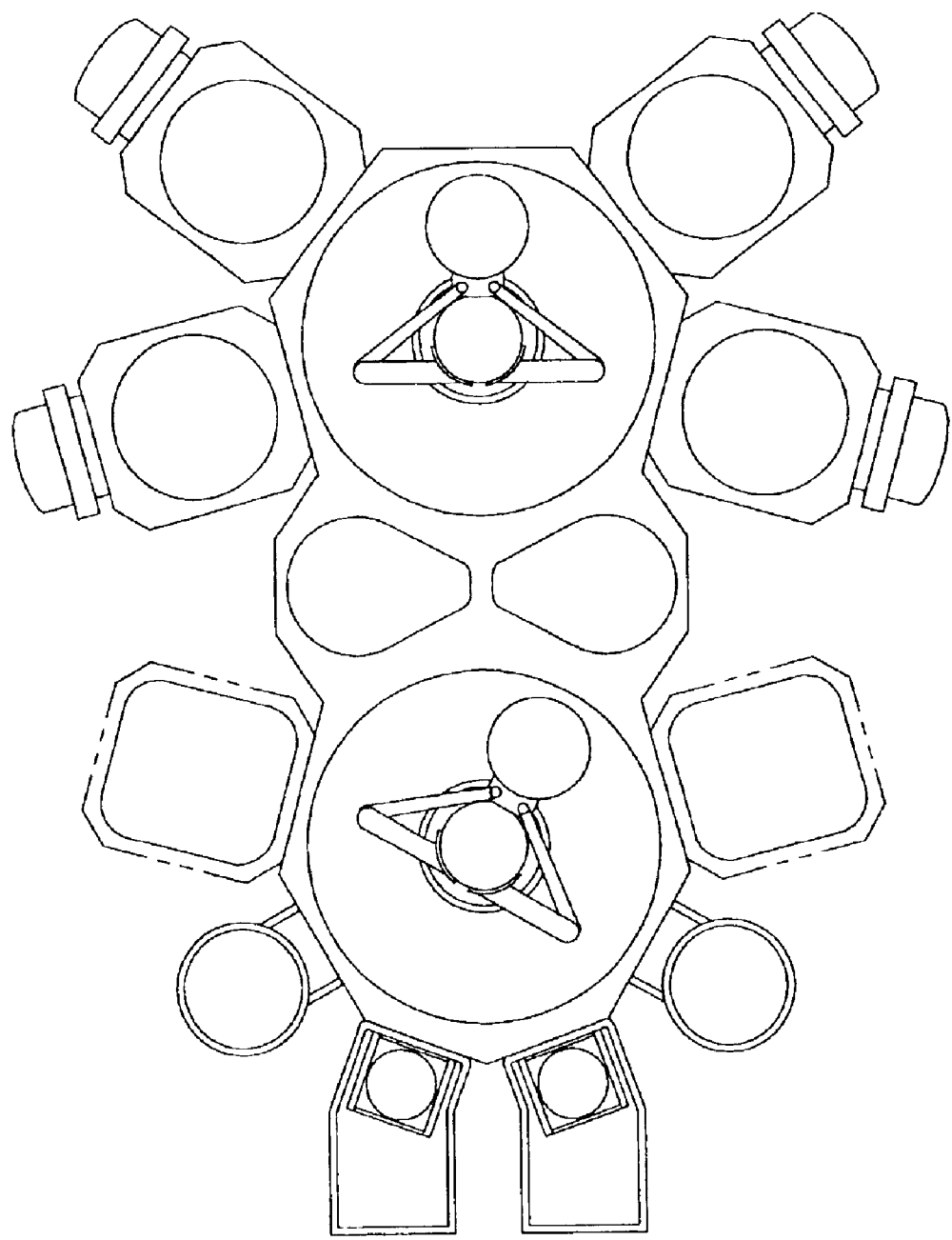
FIG. 12 is one embodiment of a cluster tool used for semiconductor processing.
Figure 13:
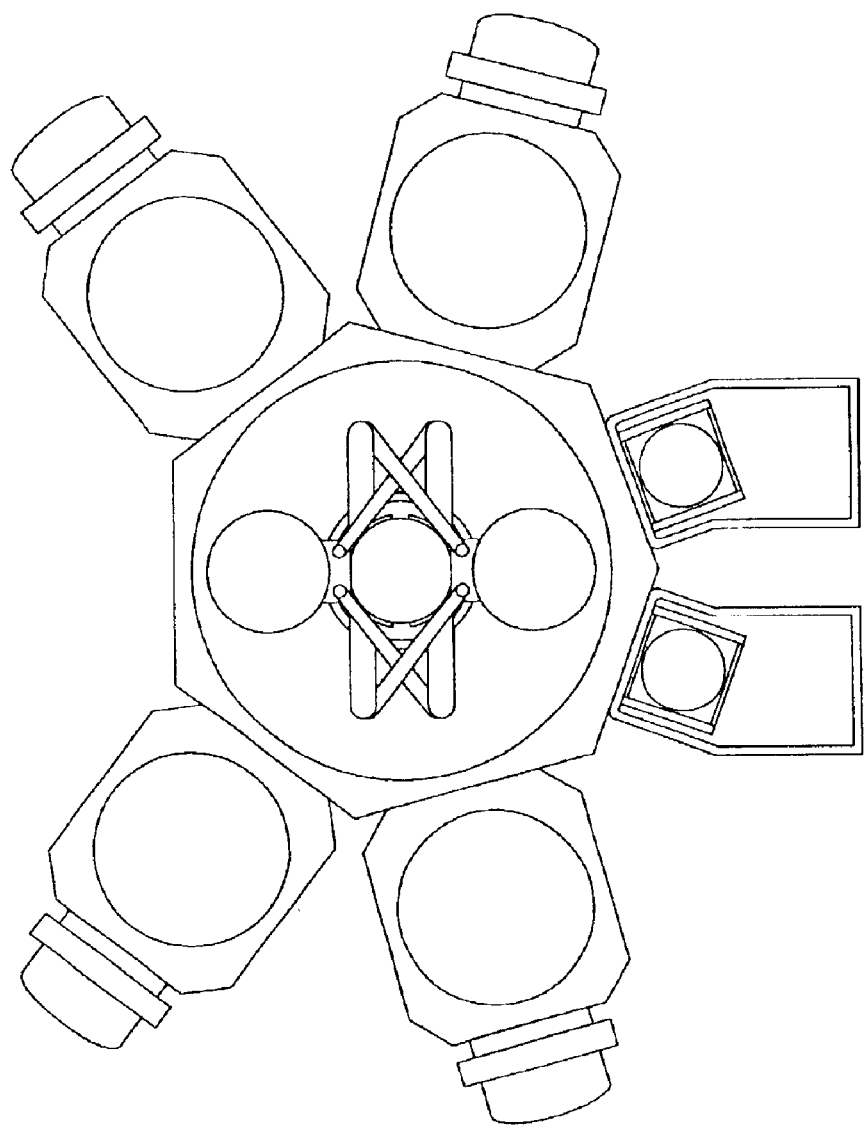
FIG. 13 is one embodiment of a cluster tool used for semi conductor processing.

Although FIG. 2 illustrates a general hardware configuration that may be used to implement the cleaning apparatus and method of the invention, alternative hardware configurations may be used to implement/support the cleaning chamber of the invention without departing from the scope of the invention. For example, processing platforms, such as the Producer, Centura, and Endura platforms, all of which are commercially available from Applied Materials of Santa Clara, Calif., may be used to support/implement the cleaning chamber of the invention. An exemplary Endura platform, as described in U.S. Pat. No. 6,251,759, which is hereby incorporated by reference, may implement an embodiment of the cleaning chamber of the invention, as illustrated in FIG. 12. Additionally, an exemplary Centura platform, as described in U.S. Pat. No. 6,074,443, which is hereby incorporated by reference, may also be used to implement an embodiment of the cleaning chamber of the invention, as illustrated in FIG. 13. Additionally, a standard front-end factory interface, which is also commercially available from Applied Materials, may be used to either communicate substrates to one or more particle removal chambers attached directly thereto, or alternatively, a particle removal apparatus may be positioned within the clean air enclosure of the factory interface itself.

B. General Cleaning Chamber Configuration

Figure 3:
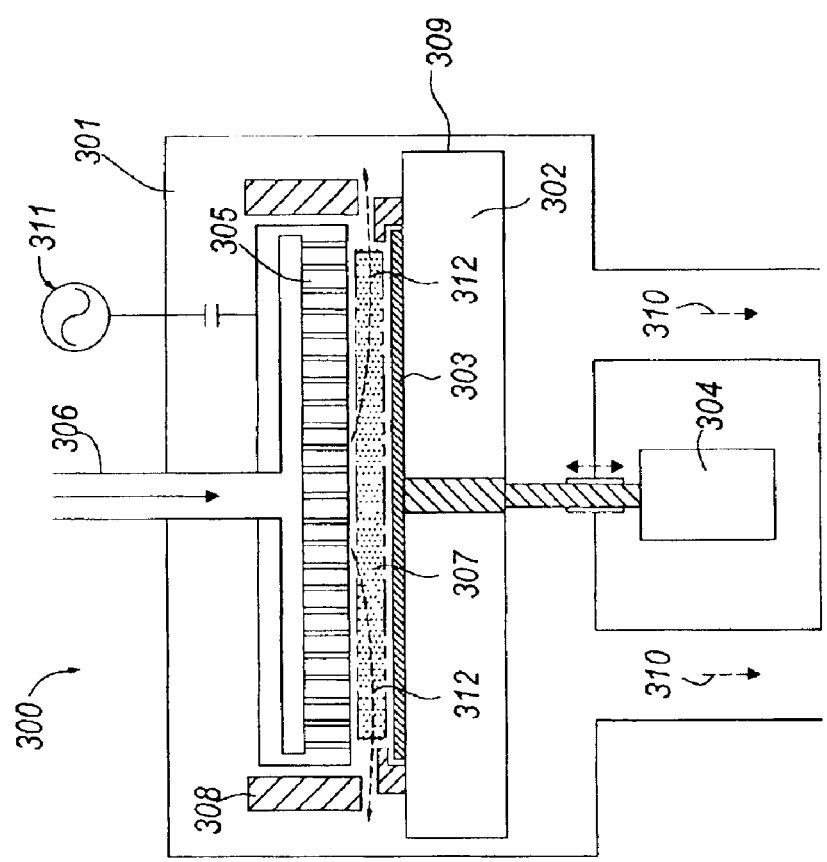
FIG. 3 illustrates an embodiment of a simplified particle removal chamber of the invention.

FIG. 3 illustrates a simplified exemplary substrate cleaning chamber 300 of the invention that may be implemented into system 100, or alternatively, another semiconductor processing platform. Apparatus 300 generally includes a chamber 301 having a substrate support member 302 positioned therein. Chamber 301 is in communication with at least one vacuum pump (not shown) through pump channels 310. Substrate support member 302 is configured to receive and secure a substrate 303 to an upper disk shaped substrate receiving member/surface formed thereon, and may be in communication with a power supply capable of supplying a bias thereto. A gas showerhead 305 is positioned above substrate 303 and is in communication with a gas supply 306. Gas showerhead 305 is manufactured from a conductive material and is in electrical communication with a power supply 311, which may be a radio frequency power supply. Power supply 311 may be capacitively or inductively coupled to the showerhead 305. Showerhead 305 may be surrounded by an annular ground shield 308, and therefore, showerhead 305 may operate as an RF electrode within chamber 301. The lower portion of substrate support member 302 is in communication with an actuator 304 configured to provide an impulse-type force to substrate support member 302 in a direction generally perpendicular to the surface of substrate 303. Actuator 304 may include a piston-type actuator assembly formed into a stem portion of the substrate support member, wherein the actuator is in communication with a selectively actuated propulsion source configured to impart motion to the piston assembly for the purpose of generating a broadband impulse. The piston assembly may be configured to travel within a bore formed into a stem of the substrate support member 302, and further, to contact a terminating end of the bore, thus transferring a broadband impulse to the substrate support member 302. Therefore, the broadband impulse generated by actuator 304 is generally generated along the axis of the substrate support member 302, i.e., perpendicular to the surface of the substrate. Alternatively, actuator 304 may include a device configured to accelerate a plurality of projectiles against a lower surface of the substrate support member 302 such that a broadband impulse sufficient to dislodge contamination particles from a substrate surface is imparted to the substrate support member 302. Further, various pressure differentiator configurations, solenoid configurations, and electromagnetic configurations are contemplated as possible broadband actuator sources.

In operation, a substrate 303 having particles thereon for removal may be positioned in chamber 301 on substrate support member 302. A gas may be introduced into chamber 301 via showerhead 305 and an electrical bias applied between showerhead 305 and substrate support member 302. The combination of the gas and the electrical bias may be calculated to strike a plasma 307 in the area between showerhead 305 and substrate 303. Actuator 304 may then apply an impulse force to substrate support member 302, thus causing substrate support member 302 and the substrate 303 positioned thereon to rapidly accelerate upward. After the initial upward acceleration, the particles on substrate 303 experience a restoring/repulsive force that operates to dislodge the particles from the substrate surface. Once the particles are dislodged, they enter into plasma 307 and become negatively charged. This charge, in conjunction with the gas flow pattern from showerhead 305 to pump channels 310, causes the particles to travel outward above the surface of substrate 303, as generally indicated by arrows 312. The particles are drawn into pump channels 310 via an annular pump channel 309 surrounding substrate support member 302 and are therefore removed from chamber 301.

In another embodiment of chamber 300, the gas showerhead assembly 305, gas supply 306, and power supply 311 may be eliminated. In this embodiment the particles residing on the substrate may still be dislodged from the substrate with an impulse generated by actuator 304, however, a plasma is not utilized to remove the dislodged particles from the area proximate the substrate surface, as in the previous embodiment. Rather, an air knife assembly (not shown) may be implemented into chamber 300 and used to sweep dislodged particles away from the surface of the substrate. The air knife assembly may be positioned in chamber 300 proximate the perimeter of the substrate 303 so that a confined laminar-type stream of high pressure air generated by the air knife assembly may be easily directed toward the substrate surface. The air stream generated by the air knife generally travels proximate the substrate surface in a direction that is generally parallel to the substrate surface so that any particles dislodged therefrom may be swept away from the substrate surface by the air stream.

In another embodiment of chamber 300, the substrate support member 302 may be modified with reinforcement members so that deflection of the substrate support member 302 as a result of the impulse generated by actuator 304 may be minimized. Reinforcement members may include a hemispherically shaped support member positioned between the bottom of substrate support member 302 and the top of the shaft providing support thereto. Other reinforcement structures, such as triangular shaped members, for example, may also be used to reinforce substrate support member 302 and prevent deflection thereof by the impulse generated by actuator 304.

A cleaning chamber of the invention may also include an acoustic monitoring device (not shown) configured monitor the acoustic signature of the substrate support member during the particle removal process. The acoustic monitoring device, which may be a microphone, is in communication with a system controller (not shown). The system controller may be a microprocessor-based control system, for example, configured to receive input from the acoustic monitoring system representative the acoustic signature of the substrate support member during the particle removal process. The measured acoustic signature may be compared to reference signatures by the system controller to determine when a system fault is occurring or is about to occur.

C. Cleaning Chamber Using an Air Knife and a Reinforcement Member

Figure 6:
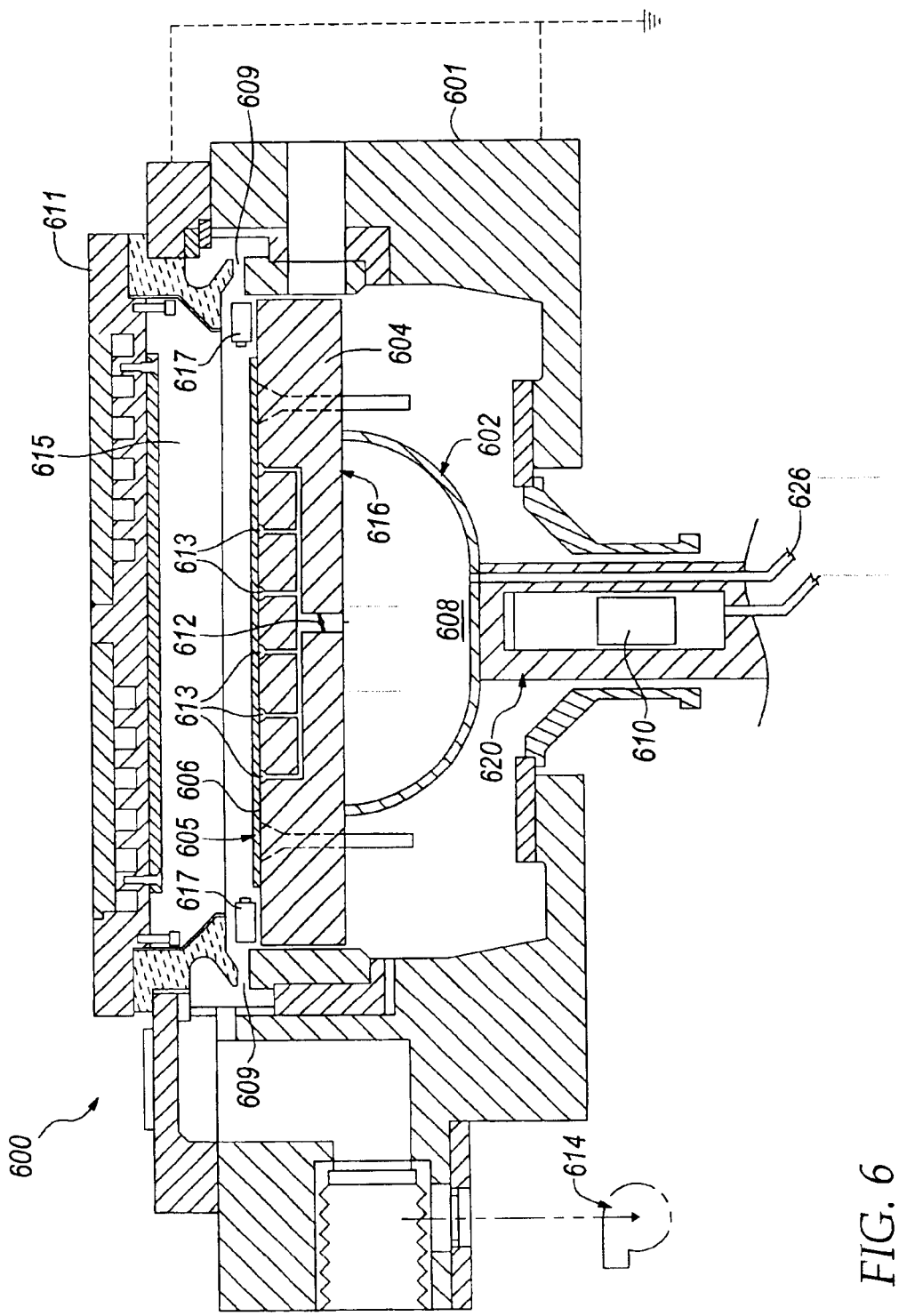
FIG. 6 illustrates an embodiment of a mechanically actuated air knife based particle removal chamber of the invention incorporating substrate support member reinforcement members.

FIG. 6 illustrates a sectional view of an embodiment of a substrate cleaning chamber 600 of the invention. Chamber 600 includes chamber body 601 and a lid 612 that cooperatively define a processing cavity 615 therebetween. A substrate support member 604 is centrally disposed within processing cavity 615 of chamber body 601, and is configured to support a substrate 605 on an upper surface 606 thereof. Substrate support 604 may be manufactured from aluminum, stainless steel, carbon steel, ceramic materials, titanium, and/or other materials used to manufacture substrate support members in the semiconductor art. Additionally, substrate support member 604, as well as other components in chamber 600, may be coated with a non-reactive coating to prevent reactivity with processing fluids, gases, and/or plasmas used in the chamber. Coatings such as polyimide and titanium nitride (TiN), for example, may be used to coat the substrate support member 604, as well as other components of chamber 600, in order to develop resistance to etch plasmas, fluids, and gases that may be used in chamber 600.

Substrate support member 604 may be axially supported by a hemispherical support member 602 affixed to a lower surface 616 of substrate support member 604. Although various configurations for support member 602 are contemplated within the scope of the present invention, such as triangular shaped support members, for example, a hemispherical support member is preferred as a result of the structural strength characteristics exhibited therefrom. Hemispherical support member 602 may be affixed at a first location to a terminating end of shaft 620, which extends through the bottom portion of chamber body 601 to the exterior of chamber 600, where the first location of hemispherical support member 602 corresponds to the location on hemispherical support member 602 having the smallest radius. Hemispherical support member 602 may be affixed to the lower side 616 of substrate support member 602 at a second location, where the second location on hemispherical support member 602 corresponds to the location on hemispherical support member 602 having the largest radius.

The upper surface 606 of substrate support member 604 may include a plurality of vacuum apertures 613 formed therein, where each of apertures 613 is in fluid communication with a vacuum chamber 608 positioned on the lower portion of substrate support member 604. Chamber 608 is defined by the lower surface 616 of substrate support member 604 and the inner walls of the hemispherical support member 602. Substrate 605 may be supported on substrate support member 604 through, for example, a vacuum chucking process, where a vacuum is applied to the plurality of vacuum apertures 613 in order to secure a substrate thereto. The vacuum may be applied to apertures 613 by opening a valve 619 positioned between chamber 608 and apertures 613, thus bringing apertures 613 into fluid communication with vacuum chamber 608. Chamber 608 is in fluid communication with a vacuum pump (not shown) via conduit 626 formed into the lower portion of shaft 620, and therefore, chamber 608 may be maintained at a low pressure. In alternative embodiments, mechanical chucking and/or clamping processes may be implemented individually or cooperatively with a vacuum chucking process to secure a substrate to the substrate support member 604.

Figure 8:
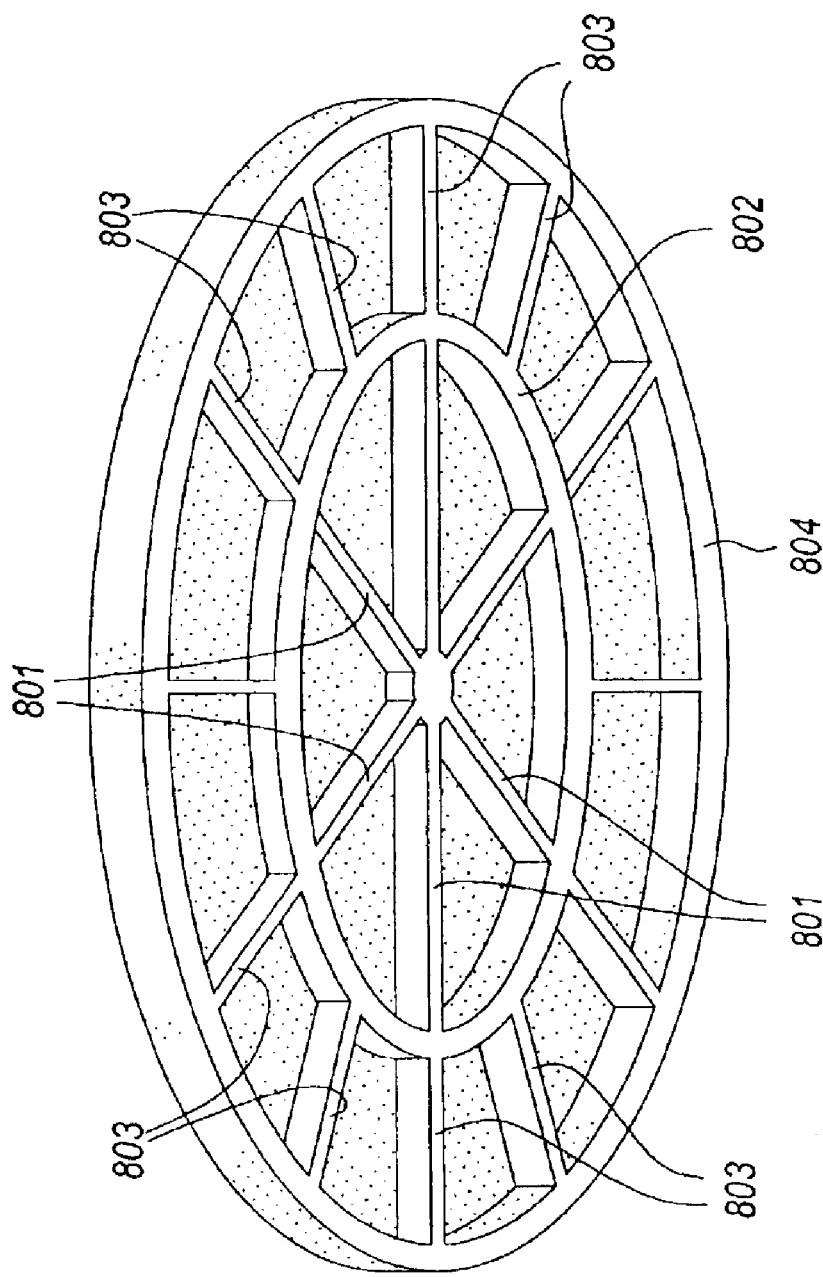
FIG. 8 illustrates a perspective view of an exemplary substrate support member of the invention.

Substrate support member 604 includes an actuator 610 positioned in or proximate to shaft 620 of substrate support member 604. Actuator 610 is configured to generate and transfer a broadband impulse force to substrate support member 604. The broadband impulse force is generally directed upward along the axis of the shaft 620 supporting substrate support member 604 in a direction perpendicular to the surface of substrate 605. Since broadband impulses are used, substrate support member 604 includes a plurality of substrate support member structural reinforcement members, as shown in FIG. 8. The reinforcement members may be manufactured into the table portion of substrate support member 604 and may be configured to transfer the broadband impulse generated by actuator 610 to upper surface 606 with minimal deflection of substrate support member 604. As illustrated in FIG. 8, the lower surface 616 of substrate support member 604 may include a plurality of inner support members 801 extending radially outward from the center of substrate support member 604. The plurality of inner substrate support members 801 may terminate in an intermediate annular support member 802. Intermediate annular support member 802 may be configured to engage the hemispherical reinforcement member 602. The outer portion of substrate support member 604 may include additional outer support members 803 that radially extend from the intermediate annular support member 802 to a perimeter support annulus 804 formed into substrate support member 604 proximate the perimeter thereof. Outer support members 803 may radially extend from an inner substrate support member 801, or alternatively, outer members 803 may radially extend from a location on intermediate annular support member 802 not associated with an inner support member 801. Although a specific structural reinforcement pattern for substrate support member 604 is disclosed in FIG. 8, the invention is not limited to any particular structural support pattern, as other known structural reinforcement patters, such as triangular and honeycomb-type patters, for example, may be implemented in order to reinforce substrate support member 604. Further, although specific size/proportions of the substrate reinforcement members is illustrated in FIG. 8, the invention is not limited to any particular size/proportion of reinforcement members. Various sizes and shapes for the substrate support member and the reinforcing members formed therein may be implemented to satisfy the specific parameters of individual applications.

An annular pumping channel 609 is positioned about the perimeter of the chamber body 601 proximate the edge of substrate support member 604. Pumping channel 609 is in communication with a pumping device 614, such as a vacuum pump, for example. The structural configuration of pumping channel 609, in conjunction with the central location of substrate support member 604, operates to generate a gas flow that radiates outward from the center of substrate support member 604. An air knife assembly 611 configured to generate a confined high pressure laminar-type stream of gas that may be directed proximate the surface of substrate 605 in a direction that is generally parallel to the surface of the substrate is positioned proximate the perimeter of substrate support member 604. Therefore, once actuator 610 has generated a broadband impulse sufficient to dislodge the particles from the substrate surface, air knife 611 may be used to sweep the particles away from the substrate surface and into pumping channel 609 for removal from chamber 600.

In operation, chamber 600 operates to remove particles from a substrate using mechanical forces. The substrate having particles thereon 605 is positioned on substrate support member 604 by a robot (not shown). The substrate 605 is then vacuum chucked to the substrate support member 604 via opening of valve 609, which operates to bring apertures 613 into fluid communication with vacuum chamber 608. Vacuum chamber 608, which is formed by the inner walls of hemispherical support member 602 and the lower surface 616 of substrate support member 604, is in communication with a vacuum source (not shown) via conduit 626. Once substrate 605 is vacuum chucked to substrate support member 604, actuator 610 may be activated, which operates to generate a broadband impulse. The impulse is transmitted through hemispherical reinforcement member 602 into substrate support member 604 and then to substrate 605. This impulse causes the contamination particles on the substrate surface to be dislodged therefrom. Once the particles are dislodged, air knife 611 may be used to flow a laminar stream of high pressure air across the substrate surface, which operates to sweep the dislodged particles away from the substrate surface, thus preventing the particles from re-depositing thereon. The particles may then be removed from chamber 600 via pumping channel 609.

D. Cleaning Chamber Using an Air Bearing and an Air Knife

Figure 7:
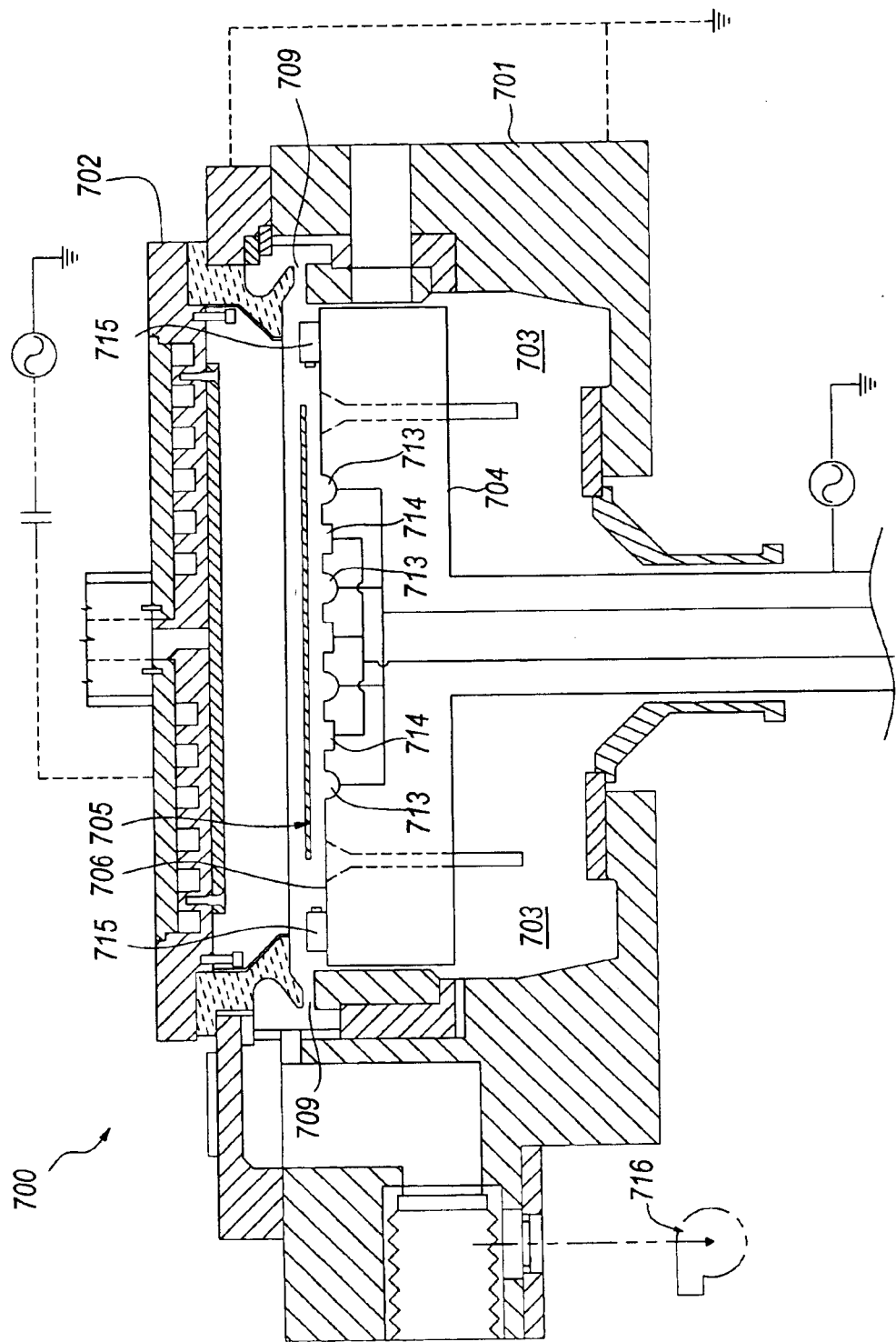
FIG. 7 illustrates an exemplary embodiment of an air bearing based particle removal chamber of the invention.

FIG. 7 illustrates another embodiment of an exemplary substrate cleaning chamber 700 of the invention. Chamber 700 includes a chamber body 701 and a lid portion 702 fitted to the top portion of the body portion 701, so that body 701 and lid portions 702 cooperatively define a processing cavity 703. A substrate support member 704 is centrally disposed within processing cavity 703. Substrate support member 704 is configured to support a substrate 705 in two ways. First, substrate support member 704 is configured to support substrate 705 on an air bearing where a gas is flowed from a plurality of apertures 714 formed into the upper surface 706 of substrate support member 704. The gas flow from apertures 714 creates a cushion of air, often termed an air bearing, that operates to support substrate 705 immediately above the upper surface 706 of substrate support member 704. The distance between upper surface 706 and substrate 705 is generally proportional to the rate of gas flow from apertures 714, and therefore, a larger gas flow generally corresponds to a greater distance. Second, substrate support member 704 is configured to support substrate 705 in a vacuum chucking configuration. More particularly, upper surface 706 also includes one or more vacuum apertures 713 formed therein, each of apertures 713 being in communication with a vacuum source (not shown). Therefore, when the vacuum source is in communication with apertures 713, substrate 705 will be vacuum chucked to substrate support member 703. An air knife assembly 715 is positioned proximate the perimeter of substrate support member 704, and is configured to generate a high pressure confined stream of air configured to sweep dislodged particles away from the substrate surface. An annular pumping channel 709 is positioned about the perimeter of the chamber body 701 proximate the edge of substrate support member 704. Pumping channel 709 is in communication with a pumping device 716, such as a vacuum pump, for example, and therefore, channel 709 is at a vacuum and operates to attract or pull particles into channel 709 once they are swept away from the substrate surface by air knife 715.

In operation, chamber 700 receives a substrate 705 on upper surface 706. Gas apertures 714 are activated and substrate 705 is elevated above upper surface 706 by an air bearing generated between substrate 705 and upper surface 706 as a result of the gas flowing from apertures 714. The gas flow to apertures 714 may then be terminated and a vacuum pump may be brought into communication with the plurality of vacuum apertures 713 positioned on the upper surface 706 of substrate support member 704. The cooperative simultaneous termination of the gas flow to apertures 714 and the communication of a vacuum pump to apertures 713 operates to rapidly eliminate the air bearing supporting substrate 705, while simultaneously generating a negative pressure region between substrate 705 and substrate support member 704. This negative pressure operates to rapidly accelerate substrate 705 toward the upper surface 706 of substrate support member 704. This rapid acceleration operates to dislodge the particles from the wells on the substrate surface. Once the particles are dislodged from the wells, they may be swept away by a laminar stream of high pressure gas generated by air knife 716, which causes a high pressure air stream to be directed across the surface of substrate 705 in a direction that is generally parallel to the substrate surface. This high pressure air flow causes the particles to be swept away from the surface of substrate 705 and toward pumping channel 709. Once the particles are pulled into pumping channel 709, they may be removed/pumped from chamber 700 so that they do not redeposit on substrate 705.

E. Cleaning Chamber Using a Plasma for Particle Removal

Figure 4:
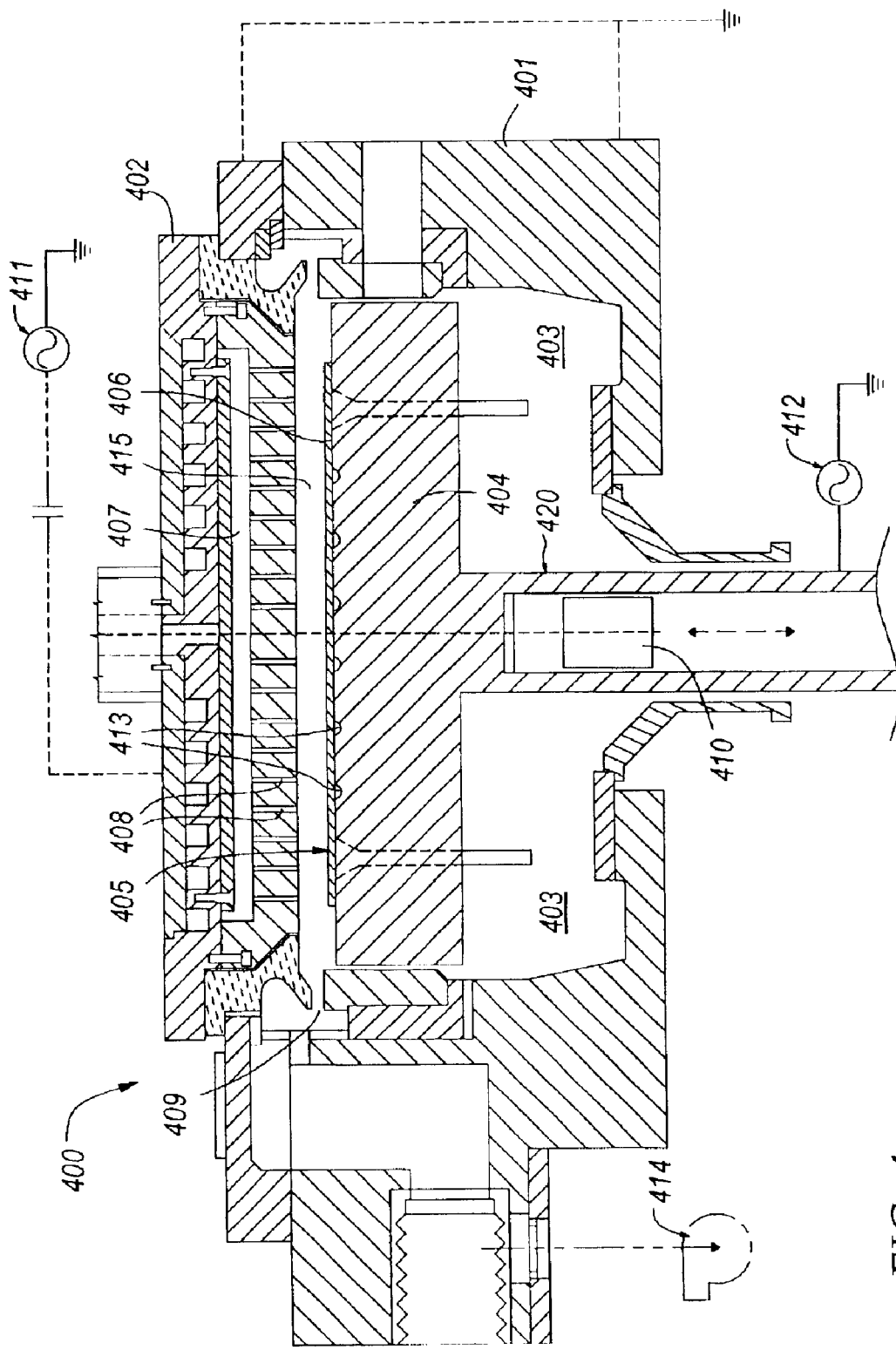
FIG. 4 illustrates a sectional view of an exemplary particle removal chamber of the invention.
Figure 5:
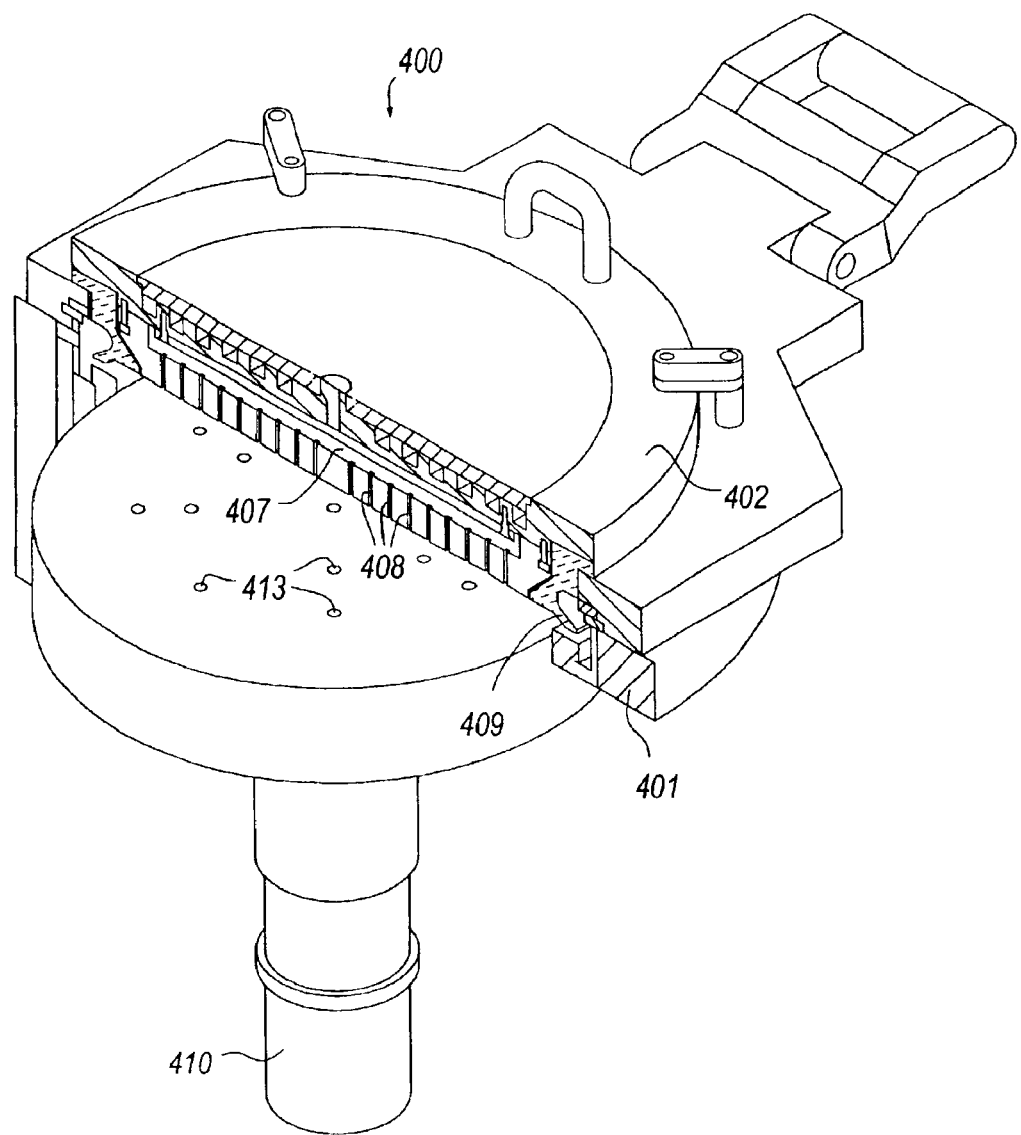
FIG. 5 illustrates a partial perspective view of the exemplary particle removal chamber of FIG. 4.

FIG. 4 illustrates a sectional view of an alternative embodiment of a substrate cleaning chamber 400 of the invention. FIG. 5 illustrates a partial perspective view of the exemplary particle cleaning chamber 400 shown in FIG. 4. Chamber 400 includes a chamber body 401 and a lid 402 that cooperatively define a processing cavity 403 therebetween. A substrate support member 404 is centrally disposed within processing cavity 403 of chamber body 401, and is configured to support a substrate 405 on an upper surface 406 thereof. Substrate support 404 may be manufactured from aluminum, stainless steel, carbon steel, ceramic materials, titanium, and/or other materials used to manufacture substrate support members in the semiconductor art. Additionally, support member 404 may be counted with a non-reactive coating, such as polyimide or titanium-nitride, for example. Substrate support member 404 is axially supported by a shaft 420 extending through the bottom portion of chamber body 401 to the exterior. Upper surface 406 of substrate support member 404 includes a plurality of vacuum apertures 413 formed therein, where each of apertures 413 are in fluid communication with a vacuum source (not shown). Substrate 405 is supported on substrate support member 404 through, for example, a vacuum chucking process, where a vacuum is applied to the plurality of vacuum apertures 413 in order to secure a substrate thereto. In alternative embodiments mechanical chucking and/or clamping processes may be implemented individually or cooperatively with a vacuum chucking process to secure a substrate to substrate support member 404. Substrate support member 404 includes an actuator 410 positioned in a shaft portion of substrate support member 404. Actuator 410 is configured to generate and transfer a broadband impulse force to substrate support member 404. The broadband impulse force is generally directed upward along the axis of the shaft supporting substrate support member 404 in a direction perpendicular to the surface of substrate 405. Since broadband impulses are used, substrate support member 404 may include one or more structural reinforcement members that may be used to strengthen the substrate support member 404 so that the impulse generated by actuator 410 does not deflect substrate support member 404. The reinforcement members may be manufactured into the table portion of substrate support member 404 and may be configured to transfer the broadband impulse generated by actuator 410 to the upper surface 406 with minimal deflection of substrate support member 404. Known structural reinforcement patterns, such as triangular and honeycomb-type patterns may be implemented into reinforcing substrate support member 404. Additionally, a support member, such as a hemispherical support member, for example, may be implemented between substrate support member 404 and shaft 420 in order to better transfer the impulse from shaft 420 to substrate support member 404.

A showerhead assembly 407 is positioned above substrate support member 404 in lid portion 402. Showerhead assembly 407 includes a plurality of gas distribution apertures 408 configured to flow a gas into a processing area 415 immediately above substrate 405 and immediately below showerhead assembly 407. An annular pumping channel 409 is positioned about the perimeter of the chamber body 401 proximate the edge of substrate support member 404. Pumping channel is in communication with a pumping device 414, such as a vacuum pump, for example. A first power supply 411 is in electrical communication with showerhead assembly, through, for example, a capacitive coupling, and a second power supply 412 is in electrical communication with the substrate support member 404. First and second power supplies 411 and 412 may cooperatively operate to generate an electrical bias between showerhead assembly 407 and substrate support member 404. This electrical bias, which combined with a process gas, may be calculated to strike and maintain a plasma in processing area 413.

In operation, apparatus 400 receives a substrate 405 having contaminant particles thereon on the upper surface 406 of substrate support member 404. Substrate 405 is secured to upper surface 406 by a vacuum chucking process, whereby a vacuum is applied to the plurality of apertures 413 formed into the upper surface 406 of substrate support member 404. This vacuum operates to secure substrate 405 to upper surface 406 via the negative pressure applied to the backside of substrate 406 by apertures 413. Once substrate 405 is secured to substrate support member 404, a low pressure vacuum may be obtained in the processing cavity 403 through activation of pump 414. Once a sufficient pressure is obtained, a plasma may be struck in processing area 415 through application of an electrical bias between showerhead assembly 407 and substrate support member 404, along with introduction of a process gas into process area 415 by showerhead 407. Once the plasma is generated and maintained, actuator 410 may deliver a broadband impulse to substrate support member 404. The broadband impulse may be calculated to dislodge unwanted particles on the surface of substrate 405. Once the particles are dislodged from the substrate surface they enter into the plasma generated in the processing region 415 and become charged as a result thereof. This charge, along with a radial gas flow generated by annular pumping channel 409, operates to draw the particles away from the substrate surface into the plasma, and finally, into pumping channel 409 for removal from the processing area 413.

F. Method for Removing Particles Using a Broadband Actuator and a Plasma

FIGS. 9A–9D illustrate an exemplary method for removing particles from a substrate surface. The exemplary method begins as shown in FIG. 9A, where a substrate 900 having particles 901 thereon is secured to an upper surface of a substrate support member 902 in a particle removal chamber. Substrate 900 may be secured to substrate support member 902 through vacuum chucking, mechanical clamping, or other known methods of securing a substrate to a substrate support member. The lower portion of the substrate support member 902 includes an actuator 904 configured to deliver an impulse to substrate support member 902. Actuator 904 may be a piezo-electric actuator, an electrical actuator, an acoustic actuator, and air operated actuator, or other actuator configured to deliver a broadband impulse to the substrate support member.

Once the substrate 900 is chucked to substrate support member 902, a plasma 903 is struck immediately above substrate 900, as illustrated in FIG. 9B. The plasma may be generated through, for example, flowing a gas to the area immediately above the substrate while also creating an electrical bias between the substrate support member 902 and, for example, an RF electrode positioned above the substrate support member 902. The gas flow may be introduced into the plasma and pumped away in a configuration calculated to generate a gas flow that radiates away from the center of substrate 900, through, for example, use of a gas showerhead positioned above substrate 900 and a pumping geometry configured to pull gasses outward across the substrate surface. Once the plasma is struck, actuator 904 may deliver at least one broadband impulse to substrate support member 902, as illustrated in FIG. 9C. The broadband impulse causes the substrate support member to initially accelerate in a vertical direction, however, a recoil force in the opposite direction of the initial acceleration immediately follows the initial acceleration and causes substrate support member 902 to recoil towards it's initial position. This recoil action causes particles 901 to be dislodged from the surface of substrate 900, as illustrated in FIG. 9C. Once particles 901 are dislodged, they enter into the outer region of plasma 903, and therefore become electrically charged as a result of contact with plasma 903. This charge operates to draw particles farther away from the surface of substrate 903, thus minimizing the probability that the particle will redeposit on the surface of substrate 900. Once particles 901 are drawn into plasma 903, the particles are urged to travel radially outward by the combination of plasma 903 and radial gas flow generated above substrate 900, as illustrated in FIG. 9D. Particles may then be extracted or pumped from the chamber surrounding substrate support member 902 via vacuum pumps.

G. Method for Removing Particles Using an Air Bearing, a Plasma and/or an Air Knife FIGS. 10A–10D illustrate another exemplary method for removing particles from a substrate surface. The exemplary method begins as shown in FIG. 10A, where a substrate 1000 having contamination particles 1001 thereon is received on an upper surface of a substrate support member 1002 in a contamination removal chamber. Substrate 1000 is received by substrate support member 1002 via an air bearing 1007 formed immediately above the upper surface of the substrate support member 1002. Air bearing 1007 may be formed, for example, by flowing a gas from a plurality of apertures 1004 formed in the upper surface of substrate support member 1002. The gas flow from apertures 104 operates to provide a cushion of gas or air bearing 1007 between the substrate support member 1002 and substrate 1000, thus suspending substrate 1000 just above the upper surface of substrate support member 1002. The distance substrate 1000 is suspended above substrate support member 1002 may be controlled through varying the gas flow rate from apertures 1004 formed into the upper surface of substrate support member 1002, wherein a larger gas flow from apertures 1004 increases the distance substrate 1000 is suspended above substrate support member 1002.

Once the substrate 1000 is received on air bearing 1007, the gas flow to apertures 1004 may be terminated and a vacuum pump may be brought into communication with a plurality of vacuum apertures 1005 positioned on the upper surface of substrate support member 1002. The cooperative termination of the gas flow to apertures 1004 and the communication of a vacuum pump to apertures 1005 operates to rapidly eliminate air bearing 1007 and generate a negative pressure between substrate 1000 and the substrate support member 1002. This negative pressure operates to rapidly accelerate substrate 1002 toward the upper surface of substrate support member 1002, which dislodges particles 1001 from the upper surface of substrate 1000, as illustrated in FIG. 10C. Once particles 1001 are dislodged from the substrate surface, a gas knife assembly 1006 may be activated, which causes a high pressure air stream to be directed across the surface of substrate 1000 that causes particles 1001 to be swept away from the surface of substrate 1000, as illustrated in FIG. 10D.

In another embodiment of the method illustrated in FIGS. 10A–10D, a vacuum chamber may be placed in communication with apertures 1005 via a selectively actuated valve. Therefore, when the air bearing is to be terminated, the vacuum chamber may be brought into fluid communication with apertures 1005, which causes a rapid decrease in pressure behind substrate 1000. The rapid decrease in pressure generally results from the large volume of negative pressure resident in the vacuum chamber being in communication with apertures 1005, which operates to supply vacuum to apertures 1005 more rapidly than using a conventional vacuum pump.

In an alternative embodiment, a plasma 1003 may be struck immediately above substrate 1000, as illustrated in FIG. 10B, at the same time that the substrate is being supported on the air bearing. The plasma may be generated through, for example, flowing a process gas to the processing area immediately above substrate 1000, while also applying an electrical bias between the substrate support member 1002 and an electrode positioned above substrate support member 1002. The process gas may be introduced into plasma 1003 and pumped away in a configuration calculated to generate a gas flow that radiates away from the center of substrate 1000, through, for example, use of a gas showerhead positioned above substrate 1000 and a pumping geometry configured to pull gasses outward across the substrate surface toward the perimeter of substrate 1000. Once plasma 1003 is struck and maintained, the gas flow to apertures 1004 may be terminated and a vacuum pump may be brought into communication with a plurality of vacuum apertures 1005 positioned on the upper surface of substrate support member 1002 to dislodge the particles from the substrate surface. Thereafter, the particles may be absorbed by plasma 1003 and pumped from the chamber in a like fashion to the air knife embodiment.

Figure 11A:
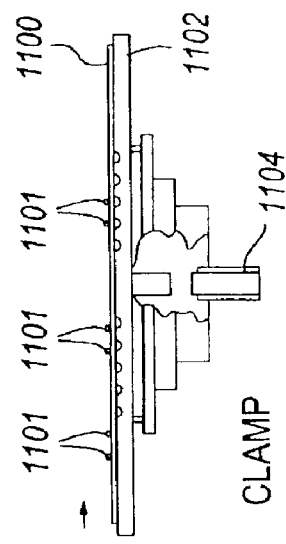
FIGS. 11A–11C illustrate an exemplary method for removing particles from a substrate using a broadband actuator and an air knife.
Figure 11C:
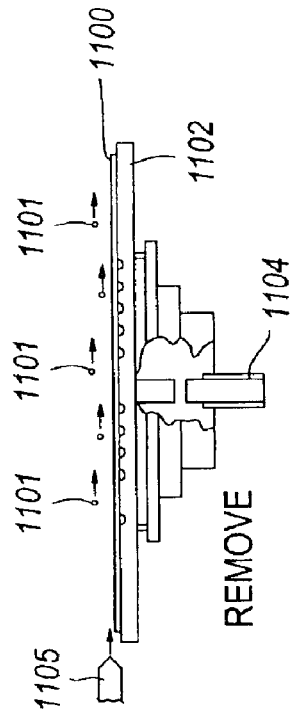

H. Method for Removing Particles Using a Broadband Actuator and an Air Knife FIGS. 11A–11D illustrate another exemplary method for removing particles from a substrate surface. The exemplary method begins as shown in FIG. 11A, where a substrate 1100 having contamination particles 1101 thereon is secured to an upper surface of a substrate support member 1102 in a contamination removal chamber, generally through a vacuum chucking process. Although substrate 1100 is secured to substrate support member 1102 through a vacuum chucking process, alternative substrate chucking/securing methods, such as mechanical clamping, for example, may also be implemented. The lower portion of the substrate support member 1102 is in communication with an actuator 1104. Actuator 1104 is configured to deliver a broadband impulse to substrate support member 902 sufficient to dislodge contamination particles therefrom. Actuator 904 may be a piezo-electric actuator, an electrical actuator, an acoustic actuator, and air operated actuator, a mechanical actuator, or other actuator configured to deliver a broadband impulse to substrate support member 1102.

Figure 11B:
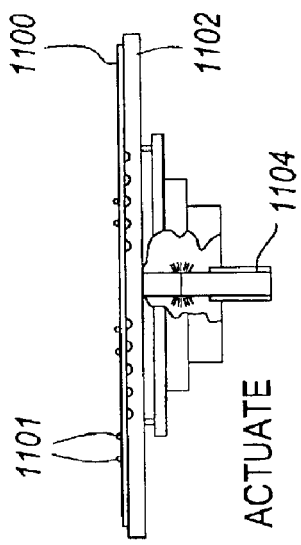

Once the substrate 1100 is chucked to substrate support member 1102, actuator 1104 may deliver at least one broadband impulse to substrate support member 1102, as illustrated in FIG. 11B. The broadband impulse causes the substrate support member to initially accelerate in a vertical direction, however, a recoil force in the opposite direction of the initial acceleration immediately follows the initial acceleration and causes substrate support member 1102 to recoil towards it's initial position. This recoil action causes particles 1101 to be dislodged from the surface of substrate 1100. Once particles 1101 are dislodged, an air knife assembly 1105 operates to dispense a high pressure laminar-type gas flow in a confined area immediately above the surface of the substrate 1100. This "knife" of air facilitates the removal of dislodged particles 1101 from the area proximate surface of substrate 1100, and causes the dislodged particles 1101 to be swept away from substrate 1100 toward the outer perimeter of the substrate 1100. Once the dislodged particles 1101 are swept away from substrate 1100, the particles 1101 may then be extracted or pumped from the chamber surrounding substrate support member 1102 via vacuum pumps.

I. Cleaning Chamber Configuration Using External Broadband Actuators

Figure 14:
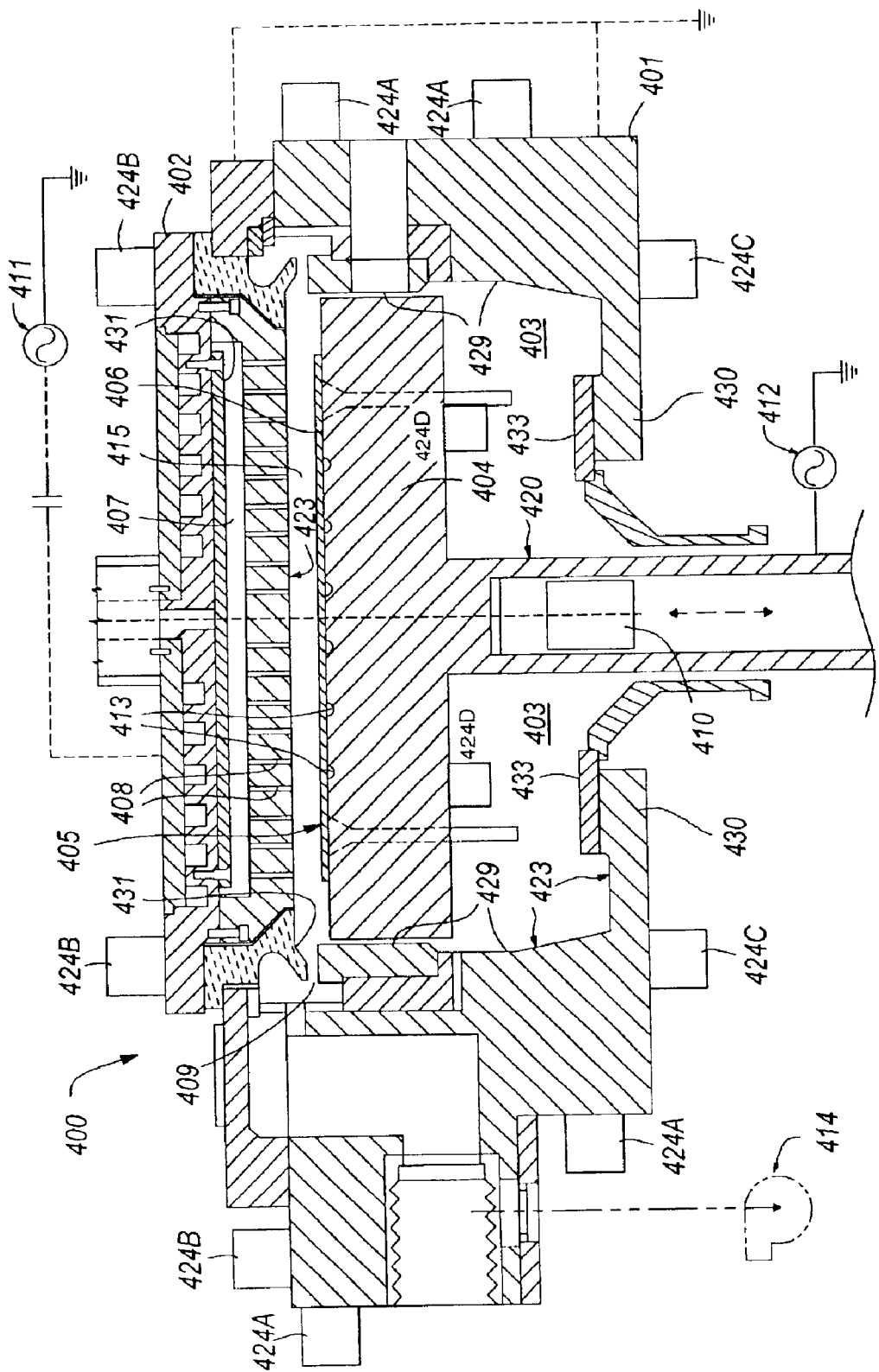
FIG. 14 illustrates a sectional view of one embodiment of an exemplary particle removal chamber of FIG. 4.
Figure 15:
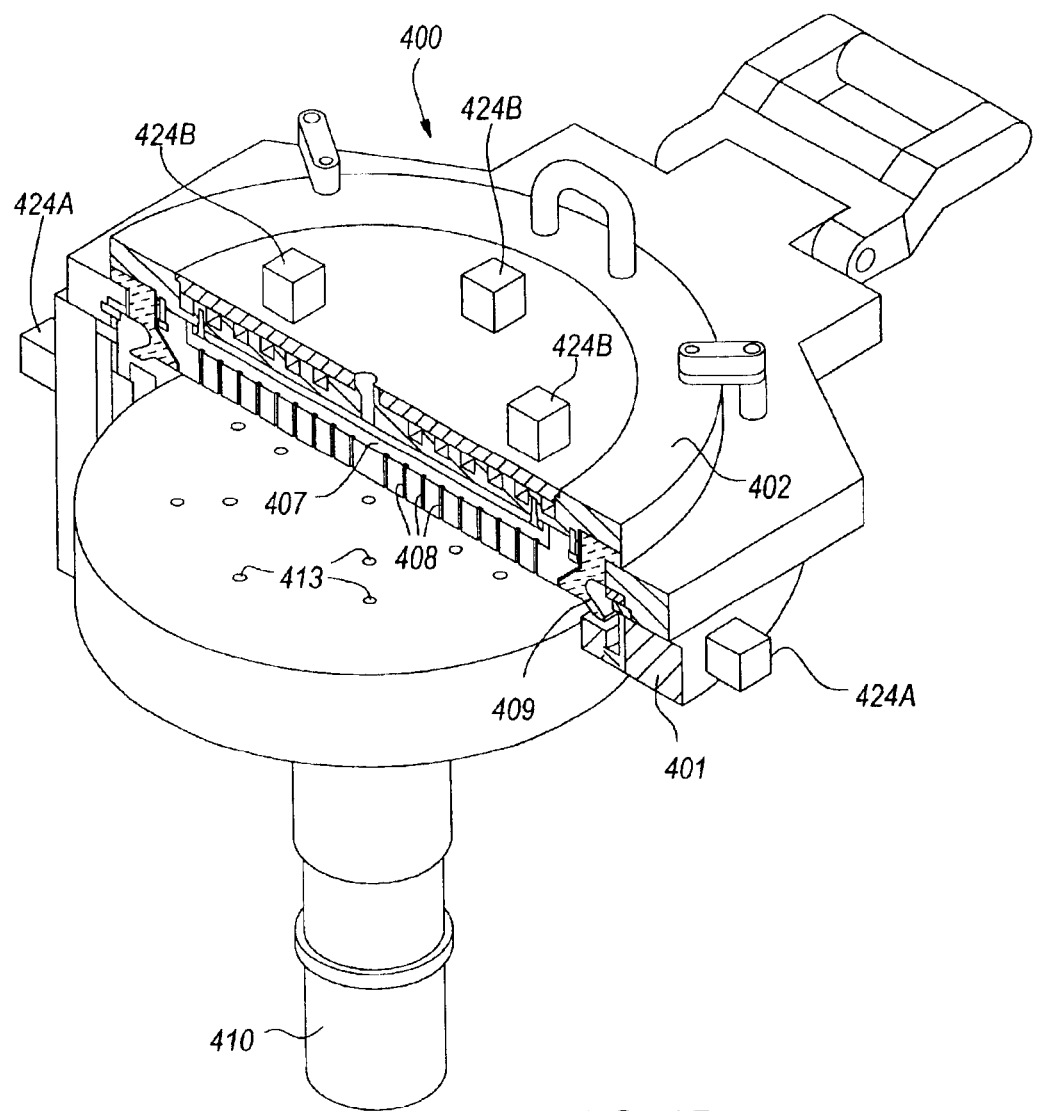
FIG. 15 illustrates a top perspective view of the exemplary particle removal chamber of FIG. 14.
Figure 16:
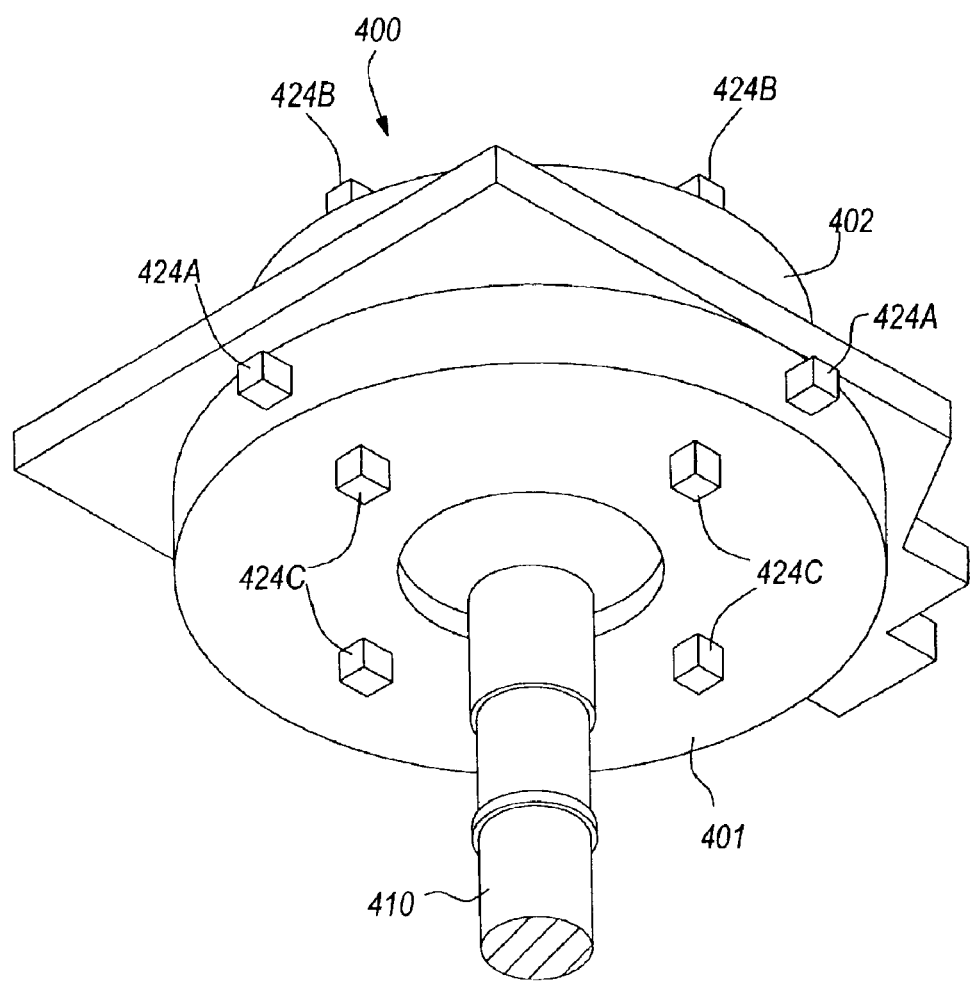
FIG. 16 illustrates a bottom perspective view of the exemplary particle removal chamber of FIG. 14.

FIG. 14 illustrates a sectional view of an exemplary substrate processing chamber of the invention, wherein the exemplary chamber is configured to clean particles from the interior surfaces of the chamber. FIG. 15 illustrates a top perspective and partial sectional view of the exemplary chamber illustrated in FIG. 14. Further, FIG. 16 illustrates a bottom perspective view of the exemplary substrate processing chamber illustrated in FIG. 14. The exemplary substrate processing chamber cooperatively illustrated in FIGS. 14–16 generally includes a plurality of broadband actuators positioned around the perimeter of the chamber. These broadband actuators, which are generally configured to communicate a broadband impulse to the chamber sufficient to dislodge contaminant particles from the interior surfaces of the chamber, may be strategically controlled and actuated in order to facilitate removal of contaminant material from the interior surfaces of the chamber. The physical structure of the broadband actuators positioned around the exemplary chamber is generally similar to the broadband actuator described in FIG. 4, i.e., the actuator generally includes a piston slidably positioned within a bore having a terminating end, and therefore, the piston is urged to contact the terminating end to generate a broadband impulse that may be transferred to whatever component is in mechanical engagement with the actuator.

More particularly, FIGS. 14–16 illustrate a plurality of external broadband actuators 424A–C (collectively referred to as actuators 424) disposed around various portions of the perimeter of the exemplary substrate processing/cleaning chamber 400. In order to clean the internal surfaces of the chamber, i.e., chamber walls 423, pump channels 409, and lid 402, the plurality of external broadband actuators 424 may be positioned in a plurality of locations around the exterior perimeter of processing chamber 400, i.e., on the bottom, sides, top, etc. Each of the external broadband actuators 424 are generally adapted to generate and apply one or more broadband impulses to the exterior wall of chamber 400 where the respective actuators are mechanically attached. The broadband impulses are generally transmitted through the chamber walls, and therefore, the internal surfaces 423 of chamber 400 are subjected to the broadband impulse generated by externally positioned broadband actuators 424. The application of the broadband impulse(s), i.e., which may be one pulse or a series of individual pulses depending upon the application, in similar fashion to the impulse(s) imparted to the substrate in the embodiments described above, operates to dislodge contaminants and/or unwanted particles adhering to the inner surface 423 of chamber walls 423. Once the contaminants or unwanted particles are dislodged from the inner surfaces 423 of the chamber 400, they may be pumped out of the chamber 400 by a suitable pump, such as pump 414, for example.

The external broadband actuators 424 may be selected to produce a plurality of different shock waves and/or broadband vibration patterns depending upon the type, size, and location of the contaminant particles on the inner surfaces of chamber 400. For example, while the external broadband actuators 424 are generally broadband impulse-type actuators, such as the actuator 304 described above, the external broadband actuators 424 may also include rotatable cam actuators, hammer type actuators, pendulum actuators, pneumatic activated actuators, magnetic speaker-driver type actuators, driven by one or more electronic solenoids, and/or other types of actuators adapted to impart a broadband impulse to the internal surfaces 423 of the processing chamber 400. In an alternative aspect of the invention, the broadband actuation may be replaced with an actuation having a particular frequency and/or duty cycle in order to detach the contaminant particles. In this embodiment, the frequency may be adjusted to vibrate continuously at one or more frequencies, and may be set to sweep between frequencies in order to impart the maximum detachment force to the contaminant. Regardless of the configuration or type of actuator used, the actuators may generally be configured to generate a broadband impulse that may be applied to the interior surface of a processing chamber in a direction that is generally perpendicular to the interior surface, as the present invention contemplates that maximum contaminant dislodging force is obtained when the dislodging impulse is applied to the surface in a perpendicular manner. An example of the perpendicularly applied force may be had by reference to FIG. 4 of previously discussed embodiments, wherein the force is applied in a vertical direction, i.e., parallel to the substrate support member stem, while the substrate surface from which particles are being dislodged is generally perpendicular thereto.

In the configuration where air or fluid actuated broadband actuators are implemented, such as the embodiments described in FIGS. 14–16, the pneumatic activated actuators may be driven by compressed air to impart an impulse to the processing chamber 400. To impart a sufficiently strong broadband impulse, the air pressure applied to the bore having the slidably mounted impulse cylinder therein may be in the range of about 40 psi to about 60 psi, for example. The actuation assemblies 424 may include a piston assembly, wherein a piston of about a half-inch diameter is slidably positioned in a bore and configured to travel longitudinally within the bore when air pressure is applied to one end of the bore. The slidable piston assembly may be configured to contact a terminating end of the bore containing the piston, thus generating an broadband impulse as a result of the piston assembly coming to an abrupt stop and transferring the kinetic energy contained therein to the stationary terminating end of the cylinder. Since the terminating end of the bore is generally disposed adjacent an external surface of the processing chamber 400, and generally rigidly attached thereto, the kinetic energy from the piston assembly is transmitted to the chamber in the form of a broadband impulse when the piston contacts the terminating end of the bore. For example, the piston may be driven about six to eight inches through the bore via the above noted air pressure, thus producing upwards of one-thousand Gs of force that may be transmitted to the chamber in the form of a broadband impulse for the purpose of dislodging contaminant material from the inner surfaces 423 of the chamber 400.

In operation, the external broadband actuators 424 may be strategically positioned around the perimeter of the chamber in order to impart a maximum acceleration to the particles adhering to the internal surfaces, as maximum acceleration generates the highest likelihood of particle detachment from the internal surfaces. In one aspect of the invention, to clean the interior sidewalls 429 of the processing chamber 400, the external sidewall actuators 424A are placed in different positions along the external sidewalls adjacent the interior sidewalls 429. In one embodiment, the external sidewall actuators 424A may be positioned adjacent locations within the chamber where contaminant particles are known to adhere to the inner chamber walls. In another embodiment, the sidewall actuators 424A may be spaced radially around the perimeter of the chamber, and more particularly, the actuators may be equally spaced in a radial pattern around the perimeter of the chamber so that the total impulse forces generated by the actuators is generally spread equally across the inner surfaces of the chamber, thereby supplying a sufficient particle removal impulse to the entire inner surface of the chamber.

In another aspect of the invention, one or more upper actuators 424B may be positioned or attached to the outer surface of lid 402 of processing chamber 400 and positioned with respect to the external sidewalls of the processing chamber 400 to direct the broadband impulse and/or vibration to a particular region of the interior surfaces of the lid 402 exposed to processing. For example, to clean a perimeter portion of the lid interior surface 431, the upper actuators 424B may be aligned proximate the perimeter of the lid interior surfaces 431. To clean a central portion of the lid interior surface 431, the upper actuators 424B may be positioned proximate the center of the lid member on the outer surface thereof.

In yet another aspect of the invention, one or more lower actuators 424C may be positioned on the exterior surface of the bottom 430 of the processing chamber 400 and positioned with respect to the external sidewalls of the processing chamber body 401 to direct the broadband impulse and/or vibration to a particular region of the interior surfaces of the bottom 430. For example, to clean an outer perimeter portion of the bottom interior surfaces 433, the lower actuators 424C may be aligned perpendicular to the outer perimeter portion of the bottom interior surfaces 433 on the exterior surface of the bottom 430. To clean a central inner portion of the bottom interior surfaces 433, the lower external actuators 424C may be positioned about perpendicular to the center of the inner central portion of the bottom interior surfaces 433 on the outer surface of bottom 430.

In operation, in order to impart a maximum vibration or impulse, the external actuators 424A–C may be sequentially triggered, i.e., the actuators may be triggered at different times. Specific groups of external actuators 424A–C may be triggered simultaneously or in a predetermined sequence to clean sections of the processing chamber 400. For example, in one configuration, three sidewall actuators 424A are spaced uniformly around the exterior sidewalls of the processing chamber 400. In this configuration, each of the three sidewall actuators 424A may be triggered sequentially to allow the vibration and/or broadband impulse to dissipate before triggering the next sidewall actuator 424A. When utilizing more than one actuator 424A–C, the shockwaves and/or impulses are generally allowed to dissipate between each actuator activation, in order to minimize the cancellation of the impulses, however, it is contemplated that the impulses may be combined to impart a larger contaminant detachment force.

Once the contaminant particles are removed from the interior surfaces of the processing chambers via the broadband impulse(s), the contaminants may be removed from the processing chamber using one of a plurality of methods. For example, chamber pumping assemblies may be used to pump the contaminants from the chamber. Alternatively, as noted above with respect to the removal of contaminants from substrate surfaces, if the inner walls are planar, i.e. such as lid and bottom members, for example, then laminar gas flows may be used to carry dislodged particles away. Alternatively, a plasma may be generated in the chamber during the particle removal process. The plasma may then be used to carry the dislodged particles away from the surface, and thereafter, a pumping system may be used to remove the particles from the chamber. In yet another aspect of the invention, the interior surfaces 423 may be analyzed by an optical detector (not shown) to determine a force to be applied to the interior surface that is sufficient to dislodge particles therefrom.

Further, embodiments of the invention contemplate utilizing a system controller (not shown) to control the actuation sequence of the various actuators 424. More particularly, embodiments of the invention contemplate utilizing, for example, a microprocessor-based controller to control the sequence of actuations around the perimeter of chamber 400. The controller, which may be configured to follow a process recipe, for example, may operate to actuate various actuators 424 around the perimeter of chamber 400 in a predetermined sequence, with predetermined rest periods between the respective actuations. Further, the controller may be configured to receive measurements indicative of the presence of particles on the inner surfaces of the chamber 400, and in response thereto, cause one or more of the externally positioned actuators to impart one or more impulses to the area proximate the area where the contaminants are known to reside. For example, if a particle detection device determines that contaminant particles are present on a particular portion of the sidewall of chamber 400, as well as on the perimeter portion of the inner surface of the lid, then the controller may be configured to cause one or more actuators positioned adjacent the sidewall and lid portions determined to have contaminant particles residing thereon to actuate, thus dislodging the contaminant particles from the inner surfaces. Further still, the controller may be configured to calculate a force required to dislodge the contaminant particles from the interior surface of the chamber, and then control the appropriate actuator(s) to generate the calculated force in the area proximate the measured contamination particles. Thereafter, the dislodged contaminant particles may be purged from the chamber 400 through, for example, a pumping process.

J. Method to Enhance Chemical Reactions

In another aspect of the invention, in order to improve substrate process throughput, broadband impulses may be used to enhance substrate processing. For example, during substrate processing, chemical reaction rates (i.e. chemical attack rates) on the surface of the substrate have been shown to be related to the plasma energy density and the surface area exposed to the plasma. Therefore, in order to increase the expose surface area of the substrate to the plasma, a broadband impulse may be used to agitate or jar a substrate surface to circulate or increase the exposed surface area of the substrate exposed to the outer periphery of the plasma (i.e., the sheath). The broadband impulses may generally be used to strain (e.g., flex, expand, etc.) the substrate surface layer, therefore exposing more surface area to the plasma, i.e., the flexing/straining of the substrate surface may expand the geometry of the substrate surface so that more regions of the substrate surface become exposed. Accordingly, the more surface area exposed to plasma, the more chemical reactions that may take place.

In one configuration, the broadband actuator 304 (see FIG. 4) may be vibrated and/or pulsed to move the substrate support member 404 toward and away from the plasma to agitate the substrate surface. Depending on the processing sequence, the actuator 304 may be activated simultaneously with respect to plasma generation for a particular step, or alternatively, the actuator 304 may be actuated throughout the processing regime. For example, for a plasma dry ashing process to remove the photoresist from an etched substrate, the actuator 304 may be pulsed continuously, swept through a plurality of different broadband pulses, or given a duty cycle of one or more impulses to impart one or more broadband impulses to the substrate support member 304 during the ashing process. While it is preferred that the broadband impulse be substantially perpendicular to the substrate surfaces being processed and of sufficient magnitude to stir or agitate the substrate surface being processed to increase the exposed surface area, the broadband impulse magnitude and direction may be adjusted to allow the impulse to travel at different angles and to move into different regions of the surface of the substrate with more or less force. For example, a broadband impulse may be set to travel from the venter of a substrate support member toward an outer periphery of the substrate support member 304 to move the outer periphery a greater distance relative the inner region of the substrate support member 304. In another aspect, it is contemplated that a metrology detector (not shown) may be used to analyze the substrate during and/or after the processing to determine the correct broadband impulse profile, speed, frequency, force, etc., to be used for more efficient substrate processing.

K. Method of Determining the Contamination on the Interior Surfaces of a Processing Chamber In another embodiment of the invention, as illustrated in FIG. 14, an internal or external particle/gas exhaust monitor 440 may be used to inspect the exhausted process gas from process chamber 400 for particle contaminants contained therein. The exhaust may be analyzed to determine the accumulation/concentration of contaminant particles adhering to the interior surfaces 423 of the process chamber 400 that may eventually flake off and contaminate a substrate in process (i.e. a chamber excursion). For example, if the concentration of contamination particles in the exhaust stream increases above a predetermined threshold, then it may be determined that the particle accumulation on the interior surfaces of the processing chamber 400 has reached a critical level, as the presence of contamination particles in the exhaust stream of chamber 400 has been shown to be reflective of contamination particle presence and/or accumulation on the inner chamber surfaces. In order to remove the contaminant particles from the interior surfaces of the chamber, a broadband actuator 410 (see FIG. 4) is generally used during a cleaning cycle to dislodge the contaminant particles from the surface of the substrate 405. Additionally, one or more external broadband actuators 424A, 424B, 424C, 424D, as illustrated in FIGS. 14–16, may be used to dislodge the contaminant particles from the internal surfaces 423. The dislodged particles may then be removed from the interior of the chamber via annular pumping channel 409.

In one embodiment of the invention, the particle/gas exhaust monitor 440 generally includes a particle/gas detector having an optical source (not shown), such as a laser, that is configured to illuminate the exhaust gas stream as it is purged from the interior of the processing chamber 400. Additionally, a photo detector (not shown) is generally positioned proximate the optical source and is configured to detect a portion of the optical signal that reflects off of particles traveling through the exhaust stream. For example, the particle/gas exhaust monitor 440 may be positioned within exhaust port 442 between the pumping channel 409 and the pumping device 414. An optical source, such as a laser, for example, may be configured to generate and transmit an optical signal through the exhaust port 442. An optical signal detector, such as a photo detector configured to detect laser light, for example, may be positioned in the exhaust port 442 at a position that is off axis with the generated optical signal, i.e., the photo detector is generally positioned at some angle off of the axis of the laser light signal so that the laser light signal is not directly received by the photo detector. Therefore, in this configuration, when a particle travels through the exhaust stream and intersects the optical signal generated by the laser, light is reflected off of the particle, which is then detected by the photo detector positioned adjacent the optical signal path.

With regard to placement of the particle/gas exhaust monitor 440, although embodiments of the invention illustrate the monitor 440 being placed as close to the pumping channel 409 as possible, which generally operates to minimize contaminant accumulation within the exhaust port 442, it is also contemplated that the particle/gas exhaust monitor 440 may be positioned further downstream toward the pumping device 414. It is also contemplated that the particle/ gas exhaust monitor 440 may be positioned externally to the exhaust port 442 and in optical communication with contaminant particles floating therein. The particle/gas exhaust monitor 440 may also be optically coupled to the inside of a separate exhaust tube (not shown) that defines a secondary exhaust port coupled from the annular pumping channel 409 to an external pumping device.

In one aspect of the invention, the particle/gas exhaust monitor 440 is used to detect various contamination parameters, such as, contaminant particle sizes, which may be used to "fingerprint" the process chamber 400. Accordingly, the contaminant size may effectively allow a chamber operator, or microprocessor controller, to determine the health (the ability of the chamber to produce substrates that are generally free of contaminant particles) of the processing chamber 400, which generally yields the ability to conduct in situ defect source identification and correction. The in situ process may also include detecting other contamination values, such as a number of contaminants being removed, wherein if the number of contaminants removed exceeds a predetermined or calculated threshold level, then an operator and/or a microprocessor controller may determine that the chamber has been purged of the previously determined contaminant particles.

As noted above, embodiments of the invention generally include a system controller configured to regulate and/or control the operation of the components of processing system 400. In particular, with regard to the method for determining the presence of contaminants on the interior surfaces of the chamber walls, the system controller may be configured to regulate and both the operation of the particle detector 440 and the individual broadband actuators 424 position around the perimeter of chamber 400. For example, the system controller, which may be a microprocessor based controller configured to execute a processing recipe within chamber 400, may be configured to monitor the exhaust port 442 for the presence of contaminant particles therein. More particularly, the system controller may be configured to receive an input from the particle/gas monitor 440 positioned in the exhaust port 442, wherein the input is representative of the presence, i.e., concentration, size, etc., of contamination particles in the exhaust stream. The system controller may process the input received from the particle/gas monitor 440 and determine if the presence of contamination particles in the exhaust stream is indicative of particle contamination buildup on the interior surfaces of chamber 400, and more particularly, if the presence of the contamination particles in the exhaust stream is indicative of contamination buildup on the interior surfaces of chamber 400 that requires removal therefrom in order to maintain substrate processing with minimal contamination. This determination may be made through, for example, comparison of the input received from the particle/gas monitor 440 to stored values that correspond to various levels of particle contamination. For example, if the particle detector 440 sends a voltage signal to the system controller having a voltage of 1.62 volts, then the system controller may index into a database of stored voltages to correlate the 1.62 volt input received from the gas/particle detector 440 with a known level of particle contamination.

Once the level of particle contamination is determined, the system controller may determine if the concentration of contaminant particles in the exhaust stream is indicative of an excess of contaminant particles on the interior walls of chamber 400. If so, then the system controller may actuate one or more of the broadband actuators 424 positioned around the perimeter of chamber 400. As noted above, actuation of the broadband actuators 424 generally operates to dislodge contaminant particles from the interior surfaces of chamber 400, and thereafter, the dislodged particles may be pumped or otherwise purged from the interior portion of chamber 400.

In another embodiment of the invention, the system controller and the particle detector 440 may cooperatively be used to determine when a chamber cleaning process is completed. For example, the system controller may be used to control the actuation of one or more broadband actuators 424 positioned around the perimeter of the processing chamber 400. Immediately after broadband impulses are communicated to the processing chamber 400 by actuators 424, contaminant particles are expected to be detected in the exhaust stream exiting from chamber 400. As such, the particle detection apparatus 440 is expected to determine that a substantial number of particles are present in the exhaust stream immediately following actuation. However, embodiments of the invention contemplate that once the chamber is actually cleaned of contaminant particles, the exhaust stream exiting therefrom will not contain a significant amount of contaminant particles following an actuation, and therefore, the particle detection apparatus 440 contained within the exhaust stream will should not detect a significant number of contaminant particles following an actuation. Using this principle, the system controller may cause a first round of broadband impulses to be communicated to chamber 400 to remove contaminant particles from the interior walls of the chamber. Thereafter, the system controller may monitor the particle detection apparatus 440 to determine if contaminant particles were detected in the exhaust stream. If contaminant particles were detected, then the system controller may initiate a second round of broadband impulses, and then again monitor the exhaust stream for contaminant particles. Once the system controller has completed an actuation and detection cycle without detecting a significant number of contaminant particles in the exhaust stream, the system controller may then determine that the interior of chamber 400 has been substantially cleaned of contaminant particles.

While the foregoing is directed to embodiments of the invention, other and further embodiments of the invention may be devised without departing from the basic scope thereof, and the scope thereof is determined by the claims that follow.

What is claimed is:

1. A method for enhancing chemical reactions within a substrate processing chamber during substrate processing, comprising:
   supporting a substrate in a face up position on a substrate support member;
   providing a process gas into the processing chamber;
   striking a plasma of the process gas; and
   imparting at least one impulse to the substrate support member that is substantially perpendicular to a substrate surface, the at least one impulse being of sufficient magnitude to agitate the substrate surface to expand an exposed surface area of the substrate surface.

2. The method of claim 1, further comprising analyzing the substrate surface with a detector and determining a force to be applied to the substrate surface that is sufficient to increase exposure of the substrate surface to the plasma.

3. The method of claim 1, wherein the at least one impulse comprises at least one of a broadband impulse and a vibratory impulse.

4. The method of claim 1, wherein the at least one impulse is configured to direct a plurality of forces to different regions of the substrate surface.

5. The method of claim 3, wherein imparting a broadband impulse comprises actuating a piston-type actuator assembly formed into a stem portion of the substrate support member, wherein the piston-type actuator assembly is configured to provide an impulse-type force operating to generate the broadband impulse.

6. The method of claim 1, wherein the at least one impulse is of sufficient force to expand the substrate surface area exposed to the plasma to increase chemical reactions at the substrate surface.

7. The method of claim 6, wherein the at least one impulse is a broadband impulse having a force of less than about 1000 Gs.

8. A method for enhancing a chemical reaction during plasma processing between the plasma, and the surface of a substrate being processed, comprising:
   communicating one or more broadband impulses to a substrate support member disposed within the processing chamber; and
   flexing the surface of the substrate with the broadband impulses during plasma processing to expose more substrate surface area thereto, wherein flexing includes expanding the geometry of the substrate surface so that more regions of the substrate surface are exposed to the plasma.

9. The method of claim 8, wherein communicating one or more broadband impulses comprises:
   generating a broadband impulse with a broadband actuator device positioned in a stem portion of the substrate support member; and
   transferring the broadband impulse to a substrate surface through the stem portion to impart energy thereto, wherein the energy imparted to the substrate surface is sufficient to increase the surface area of the substrate surface exposed to the plasma processing.

10. The method of claim 9, wherein generating the broadband impulse comprises actuating a broadband actuator having a slidable piston assembly disposed in a longitudinal bore of the broadband actuator, the longitudinal bore having a terminating end in which the piston assembly is positioned therein, wherein the piston assembly is configured to slidable engage the terminating end at the end of a stoke, the engagement generating the broadband impulse.

11. The method of claim 9, wherein the broadband impulse has a magnitude sufficient to disturb the surface area of the substrate.

12. The method of claim 9, wherein the broadband impulse is of sufficient force to expand the area of the substrate surface exposed to plasma processing.

13. The method of claim 11, wherein the broadband impulse is less than about 1000 Gs.

14. A method for facilitating chemical reactions on the surface of a substrate within a plasma processing chamber, comprising:
   imparting a plurality of broadband impulses to a stem of a substrate support member disposed within a substrate processing chamber with a means for imparting the broadband impulses, the means for imparting the impulse being in mechanical communication with the substrate support member; and
   flexing the substrate surface with the broadband impulses during substrate processing, wherein flexing increases the surface area of the substrate exposed to a substrate processing environment.

15. The method of claim 14, wherein imparting the plurality of broadband impulses comprises providing a broadband actuator to the substrate support member, the broadband actuator being configured to impart broadband impulses to the substrate member.

16. The method of claim 15, wherein the plurality of broadband impulses are less than about 1000 Gs.

17. The method of claim 14, further comprising generating a plasma above the substrate surface to react with the substrate surface thereto.

18. The method of claim 17, wherein during the impulse, the substrate surface is moved to contact different electrical charge regions of a plasma sheath.

* * * * *

UNITED STATES PATENT AND TRADEMARK OFFICE
CERTIFICATE OF CORRECTION

PATENT NO. : 6,878,636 B2  
APPLICATION NO. : 10/171503  
DATED : April 12, 2005  
INVENTOR(S) : Joel Brad Bailey and Reginald Hunter Page 1 of 1

It is certified that error appears in the above-identified patent and that said Letters Patent is hereby corrected as shown below:

In the Specification

Column 8, Line 61: Chang each instance of "patters" to --patterns--

Column 13, Line 14: Change "104" to --1004--

Column 18, Line 65: Change "venter" to --center--

Signed and Sealed this

Fifteenth Day of August, 2006

JON W. DUDAS  
*Director of the United States Patent and Trademark Office*